United States Patent [19]

Astle

[11] Patent Number: 5,589,829
[45] Date of Patent: Dec. 31, 1996

[54] DECODING VARIABLE-LENGTH ENCODED SIGNALS

[75] Inventor: Brian Astle, Phoenix, Ariz.

[73] Assignee: Intel Corporation, Santa Clara, Calif.

[21] Appl. No.: 329,340

[22] Filed: Oct. 26, 1994

[51] Int. Cl.⁶ .................................................. H03M 7/40
[52] U.S. Cl. ............................... 341/67; 341/106; 341/59
[58] Field of Search ............................. 341/55, 59, 67; 348/106, 384, 403, 404, 405; 382/56

[56] References Cited

U.S. PATENT DOCUMENTS

| | | | |
|---|---|---|---|
| 5,046,071 | 9/1991 | Tanoi | 375/27 |
| 5,138,316 | 8/1992 | Konishi | 341/67 |
| 5,229,863 | 7/1993 | Kao et al. | 358/426 |
| 5,267,334 | 11/1993 | Normille et al. | 382/56 |
| 5,313,298 | 5/1994 | Meeker | 348/384 |
| 5,333,012 | 7/1994 | Singhal et al. | 348/409 |
| 5,381,144 | 1/1995 | Wilson et al. | 341/63 |
| 5,504,484 | 4/1996 | Wilson | 341/67 |

*Primary Examiner*—Todd DeBoer
*Attorney, Agent, or Firm*—Steve Mendelsohn; William H. Murray

[57] ABSTRACT

Variable-length encoded signals (e.g., those corresponding to video signals) are decoded using a lookup table whose indices are shorter than the longest possible variable-length encoded signal. N bits from the encoded bit stream are used as the index to retrieve from the lookup table a table entry, which comprises a flag bit indicating whether the variable-length encoded signal is a short code signal or a long code signal, one or more code-length bits, and one or more code-value bits. If the flag bit indicates that the variable-length encoded signal is a short code signal, then the decoded signal is generated using the code-value bits, wherein the code-length bits indicate the length of the variable-length encoded signal. If the flag bit indicates that the variable-length encoded signal is a long code signal, then the decoded signal is generated using the code-value bits and one or more additional bits from the bit stream, wherein the code-length bits indicate the number of additional bits to be read from the bit stream to complete the variable-length encoded signal.

16 Claims, 22 Drawing Sheets

FIG. 7

| 0  | 1  | 5  | 6  | 14 | 15 | 27 | 28 |
|----|----|----|----|----|----|----|----|
| 2  | 4  | 7  | 13 | 16 | 26 | 29 | 42 |
| 3  | 8  | 12 | 17 | 25 | 30 | 41 | 43 |
| 9  | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 |

FIG. 17

| SH | FH | FB | FH | FB | FH | FB | FH | FB | ... | SEC |

SH = SHEADQUDENRCE
FH = FHREADEER
FB = FBROADMYE
FH = FHREADEER
FB = FBROADMYE
FH = FHREADEER
FB = FBROADMYE
FH = FHREADEER
FB = FBROADMYE
SEC = SECONDQDDUENCE

FIG. 18

| BYTE | BITS | PREFERRED VALUE | MEANING |
|---|---|---|---|
| 0 | XXXXXXXX | 11111111 | START OF SEQUENCE START CODE (SSC) |
| 1 | XXXXXXXX | 11111111 | MIDDLE OF SSC |
| 2 | XXXXXXXX | 11110100 | END OF SSC |
| 3 | XXXXXXXX | 00000010 | VERSION NUMBER |
| 4 | XXXXXXXX | | HORIZONTAL Y RESOLUTION |
| 5 | XXXXXXXX | | VERTICAL Y RESOLUTION |
| 6 | XXXX.... | | U,V HORIZONTAL SUBSAMPLING |
| 6 | ....XXXX | | U,V VERTICAL SUBSAMPLING |
| 7 | XXXXXXXX | 00000001 | ASPECT RATIO |
| 8 | XXXXXXXX | | FRAME RATE |
| 9 | XXXXXXXX | | BIT RATE |
| 10 | XXXXXXXX | | BUFFER SIZE |
| 11 | XXXXXXXX | | COMPLEXITY |

FIG. 19

| BYTE | BITS | PREFERRED VALUE | MEANING |
|---|---|---|---|
| 0 | XXXXXXXX | 11111111 | START OF FRAME START CODE (FSC) |
| 1 | XXXXXXXX | 11111111 | MIDDLE OF FSC |
| 2 | XXXXXX.. | 111100.. | END OF FSC |
| 2 | ......XX | | SPARE BITS |
| 3 | XXXX.... | 0 TO 15 | FRAME NUMBER |
| 3 | ....XXXX | 0 TO 15 | BUFFER STATUS |
| 4 | XXX..... | 0 TO 2 | FRAME TYPE |
| 4 | ...XXXXX | 0 TO 31 | QUANTIZER BASE INDEX (QBI) |
| 5 | XXXXXXXX | | TABLE SELECTION FLAGS (TS0 - TS7) |

FIG. 20

| -4 | 5 | 0 | 0 | 0 | 0 | 0 | 0 |
|---|---|---|---|---|---|---|---|
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| -6 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

5,589,829

1

DECODING VARIABLE-LENGTH ENCODED SIGNALS

BACKGROUND OF THE INVENTION

1. Field of the Invention

The present invention relates to signal processing, and, in particular, to computer-implemented processes and apparatuses for encoding and decoding video signals.

2. Description of the Related Art

This invention relates to audio/video conferencing between two or more conference nodes, where each conference node is a personal computer (PC) system communicating with the other conference nodes over a selected transmission medium. Because transmission media typically have finite bandwidths, in order to provide audio/video conferencing of satisfactory quality, each PC system preferably compresses in real time the audio and video signals corresponding to the local participant and transmits the resulting compressed signals to the PC systems of the remote participants. Each PC system also preferably receives and decompresses compressed signals from the PC systems of the remote participants to play the decompressed audio and video signals locally.

Possible transmission media include Integrated Services Digital Network (ISDN) and Public Switched Telephone Network (PSTN) telephone connections. Although ISDN connections provide a higher bandwidth than PSTN connections, ISDN connections are less readily available and more expensive than PSTN connections.

Unfortunately, conventional methods the compressing video signals, such as the H.261 (Px64) and ISO/IEC 11172-2 (MPEG) standards, require bandwidths greater than that provided by PSTN connections. As a result, these conventional video compression methods cannot be used to support audio/video conferencing over PSTN connections.

What is needed is a video compression process that can be implemented in real time on PC systems to generate compressed video signals that can be transmitted under the bandwidth constraints of PSTN connections and then decompressed in real time by the PC systems to provide satisfactory audio/video conferencing.

It is accordingly an object of this invention to overcome the disadvantages and drawbacks of the known an and to provide computer-implemented processes, apparatuses, and systems for compressing and decompressing video signals to provide satisfactory audio/video conferencing between PC systems communicating via PSTN connections.

Further objects and advantages of this invention will become apparent from the detailed description of a preferred embodiment which follows.

SUMMARY OF THE INVENTION

The present invention is a computer-implemented process and apparatus for transforming a variable-length encoded signal into a decoded signal, wherein the variable-length encoded signal comprises up to M bits. According to a preferred embodiment, N bits are read from a bit stream comprising the variable-length encoded signal, wherein N is less than M. An N-bit lookup table is accessed using the N bits from the bit stream as an index to retrieve a table entry, wherein the table entry comprises a flag bit indicating whether the variable-length encoded signal is a short code signal or a long code signal, one or more code-length bits, and one or more code-value bits. If the flag bit indicates that the variable-length encoded signal is a short code signal, then the decoded signal is generated using the code-value bits, wherein the code-length bits indicate the length of the variable-length encoded signal. If the flag bit indicates that the variable-length encoded signal is a long code signal, then the decoded signal is generated using the code-value bits and one or more additional bits from the bit stream, wherein the code-length bits indicate the number of additional bits to be read from the bit stream to complete the variable-length encoded signal.

BRIEF DESCRIPTION OF THE DRAWINGS

Other objects, features, and advantages of the present invention will become more fully apparent from the following detailed description of the preferred embodiment, the appended claims, and the accompanying drawings in which:

FIG. 7 shows a preferred zig-zag scan pattern for quantized DCT coefficients corresponding to each image block processed by the PC system of FIG. 1;

FIG. 17 is a representation of the bit stream syntax of the compressed signal generated by the pixel processor of FIG. 3 and transmitted by the PSTN interface of FIG. 2 over the PSTN network of FIG. 1;

FIG. 18 is a representation of the 12-byte Sequence Header SH of the compressed video bit stream syntax of FIG. 17;

FIG. 19 is a representation of the 6-byte Frame Header FH of the compressed video bit stream syntax of FIG. 17;

FIG. 20 shows an example of an intra block;

DESCRIPTION OF THE PREFERRED EMBODIMENT(S)

In the present invention, video image signals are encoded based on blocks of (8×8) pixels. Each block may be encoded as a skipped block, an intra block, or an inter block. The signals for a skipped block are assumed to be identical to the signals for the corresponding block of the previous frame. An intra block is encoded without reference to any previous frame. An inter block is encoded based on the differences between the current block and the corresponding block of the previous frame.

For both intra and inter blocks, the (8×8) block of signals is transformed using a discrete cosine transformation (DCT) to generate DCT coefficients. For intra blocks, the DCT coefficients are further encoded using run-length encoding and variable-length encoding. For inter blocks, DCT coefficient differences are generated based on the DCT coefficients for the current block and DCT coefficients corresponding to the corresponding block of the previous frame. These DCT coefficient differences are then further encoded using run-length encoding and variable-length encoding.

In conventional video encoding, inter blocks are encoded based on the differences between corresponding pixel values of successive video frames. As such, conventional video encoding permits motion estimation and motion compensation to be included in the video encoding and decoding processes. In the present invention, however, inter blocks are encoded based on the differences between corresponding DCT coefficients of successive video frames. As such, motion estimation and motion compensation are preferably not included in the video encoding and decoding processes.

While the absence of motion estimation and motion compensation may be an undesirable limitation in some video applications, that may not be the case for video conferencing. The paradigm for video conferencing is a fixed camera generating images of one or more relatively stationary participants (i.e., talking heads) in front of a stationary background. To the extent that there is movement in the video images (e.g., lips, hands, and slight head movement), conventional motion compensation (which is based on the estimated motion of relatively large blocks of pixels between successive video frames) does not provide significant improvement in image quality. Moreover, the cost of encoding motion vectors in terms of code size may prove prohibitive in low-bandwidth transmission environments. Thus, the present invention has been designed to accommodate the particular characteristics of the video conferencing paradigm and, as a result, the standard goal of accommodating conventional motion compensation has been de-emphasized.

Hardware Configuration

Figure 1:
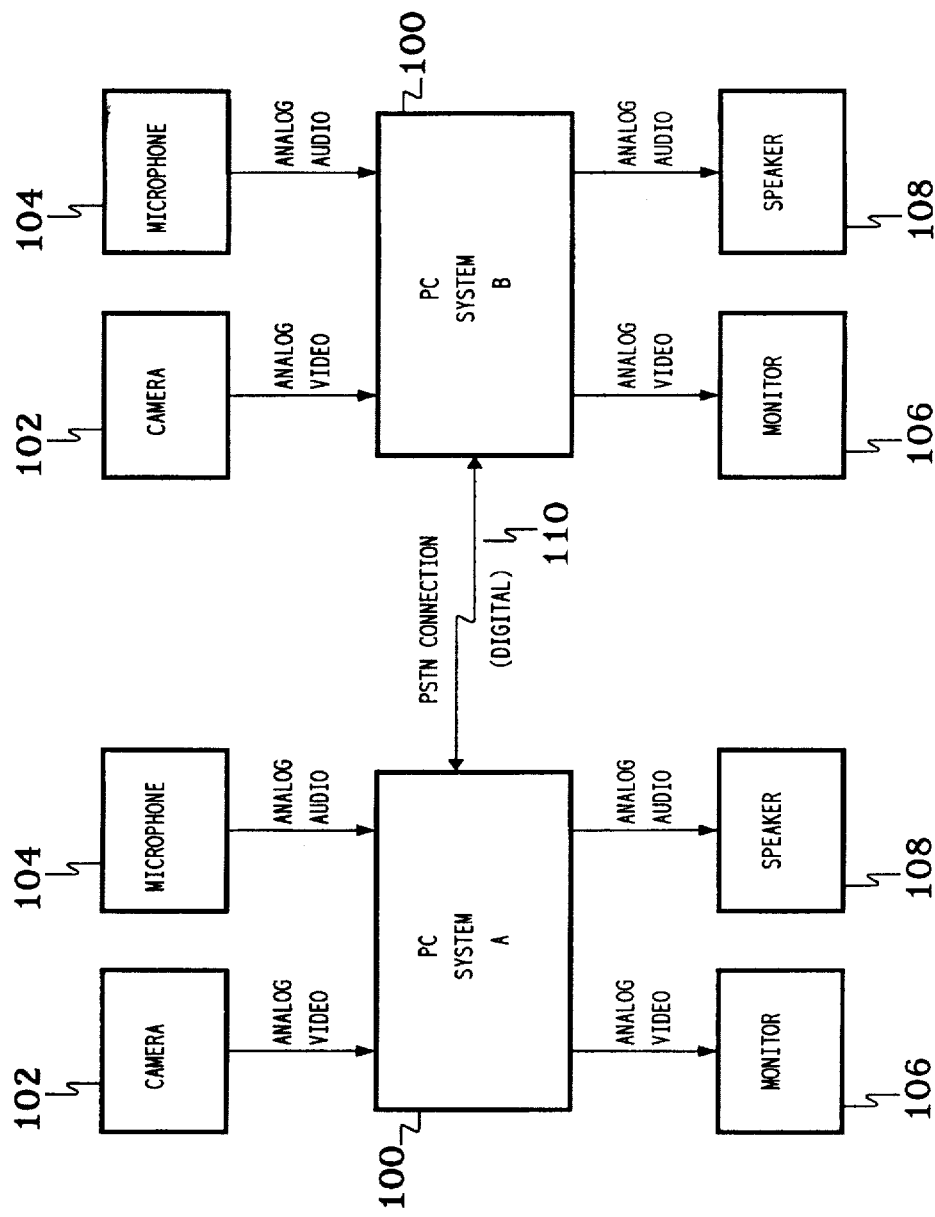
FIG. 1 is a block diagram of an audio/video conferencing network of two PC-based nodes communicating over a PSTN network, according to a preferred embodiment of the present invention.

Referring now to FIG. 1, there is shown a block diagram of an audio/video conferencing network of two PC-based nodes communicating over a PSTN connection, according to a preferred embodiment of the present invention. Each node has a PC system 100, a camera 102, a microphone 104, a monitor 106, and a speaker 108. The PC systems 100 communicate with one another via PSTN connection 110.

Each PC system 100 receives, digitizes, and compresses in real time the analog video signals generated by camera 102 and the analog audio signals generated by microphone 104. The compressed digital video and audio signals are transmitted to the other PC system via PSTN connection 110, where they are decompressed and converted in real time for play on monitor 106 and speaker 108, respectively. Each PC system 100 may optionally display the locally generated video signals as well as the decompressed remote video signals, preferably in separate windows on the monitor 106.

Camera 102 may be any suitable camera for generating analog video signals (e.g., NTSC or PAL). Microphone 104 may be any suitable microphone for generating analog audio signals. Monitor 106 may be any suitable monitor for displaying video and graphics images and is preferably a monitor with VGA or higher resolution. Speaker 108 may be any suitable device for playing analog audio signals and is preferably a headset.

Figure 2:
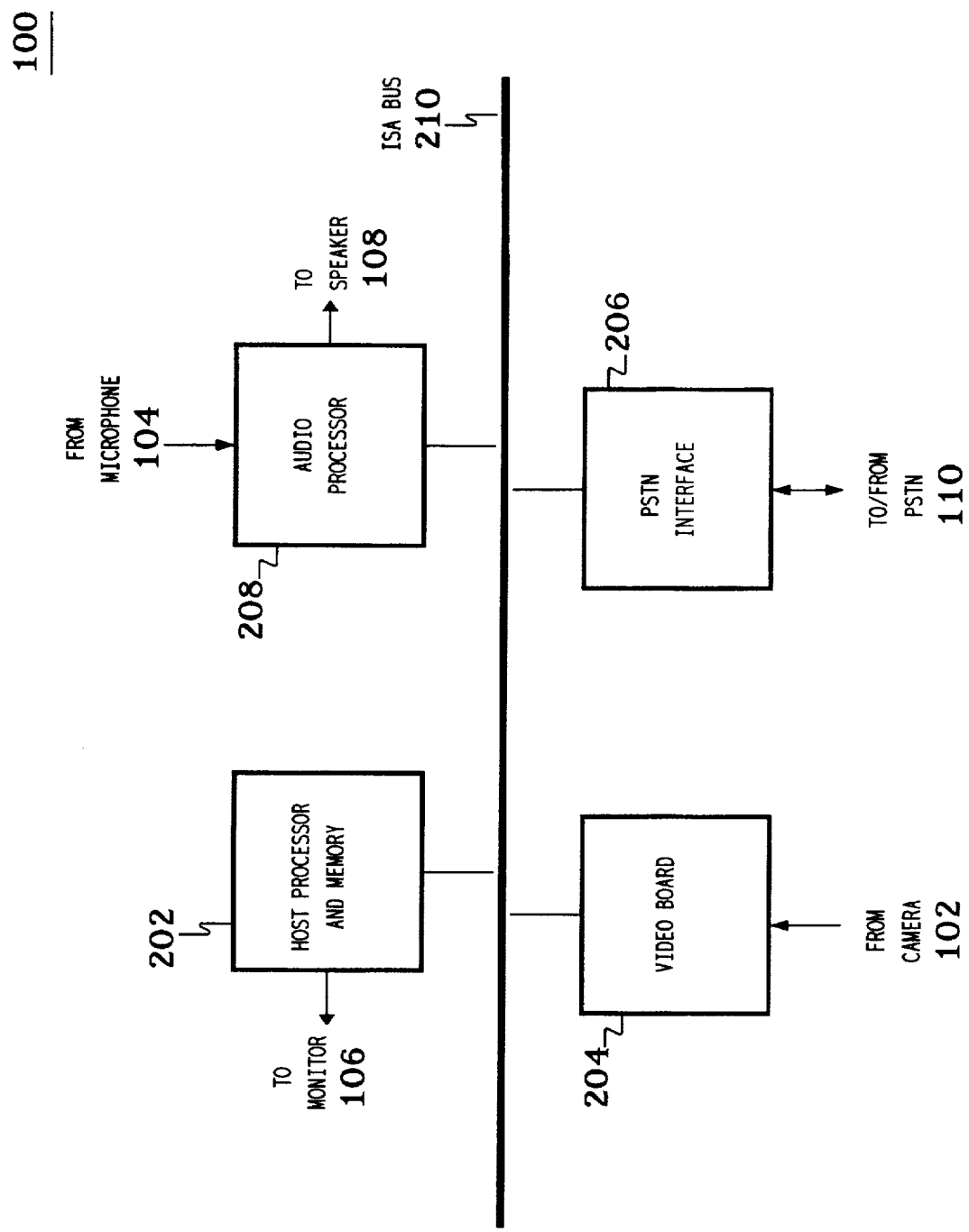
FIG. 2 is a block diagram of the hardware configuration of each PC system of the conferencing network of FIG. 1.

Referring now to FIG. 2, there is shown a block diagram of the hardware configuration of each PC system 100 of the conferencing network of FIG. 1, according to a preferred embodiment of the present invention. Each PC system 100 comprises host processor and host memory 202, video board 204, PSTN interface 206, audio processor 208, and industry standard architecture (ISA) bus 210. Video board 204 digitizes and compresses in real time the analog video signals from the local camera 102 to generate compressed digital video signals corresponding to the local conferencing participant. Similarly, audio processor 208 digitizes and compresses in real time the analog audio signals from the local microphone 104 to generate compressed digital audio signals corresponding to the local conferencing participant. PSTN interface 206 transmits the compressed video and audio signals to the PC system 100 of the remote conferencing node over PSTN connection 110.

At the same time, PSTN interface 206 receives compressed video and audio signals over PSTN connection 110 from the remote PC system 100 corresponding to the remote conferencing participant. The compressed video signals are decompressed in real time by host processor 202 for display in a window on monitor 106. The compressed audio signals are decompressed in real time by audio processor 208 for play on speaker 108.

Host processor 202 may be any suitable general purpose processor and is preferably an Intel® microprocessor such as an Intel® 386, 486, or Pentium® processor. Host processor 202 preferably has at least 8 megabytes of host memory. PSTN interface 206 may be any suitable means for interfacing with a PSTN network. Bus 210 may be any suitable digital communications bus and is preferably an ISA PC bus. Audio processor 208 may be any suitable means for digitizing, compressing, and decompressing audio signals in real time and is preferably a digital signal processor such as a Texas Instruments TMS320C31 digital signal processor implementing a G.728 or CELP (code excited linear prediction) algorithm. Those skilled in the art will understand that, in alternative preferred embodiments of the present invention, some of the audio processing implemented by audio processor 208 of FIG. 2 may be implemented by host processor 202.

Figure 3:
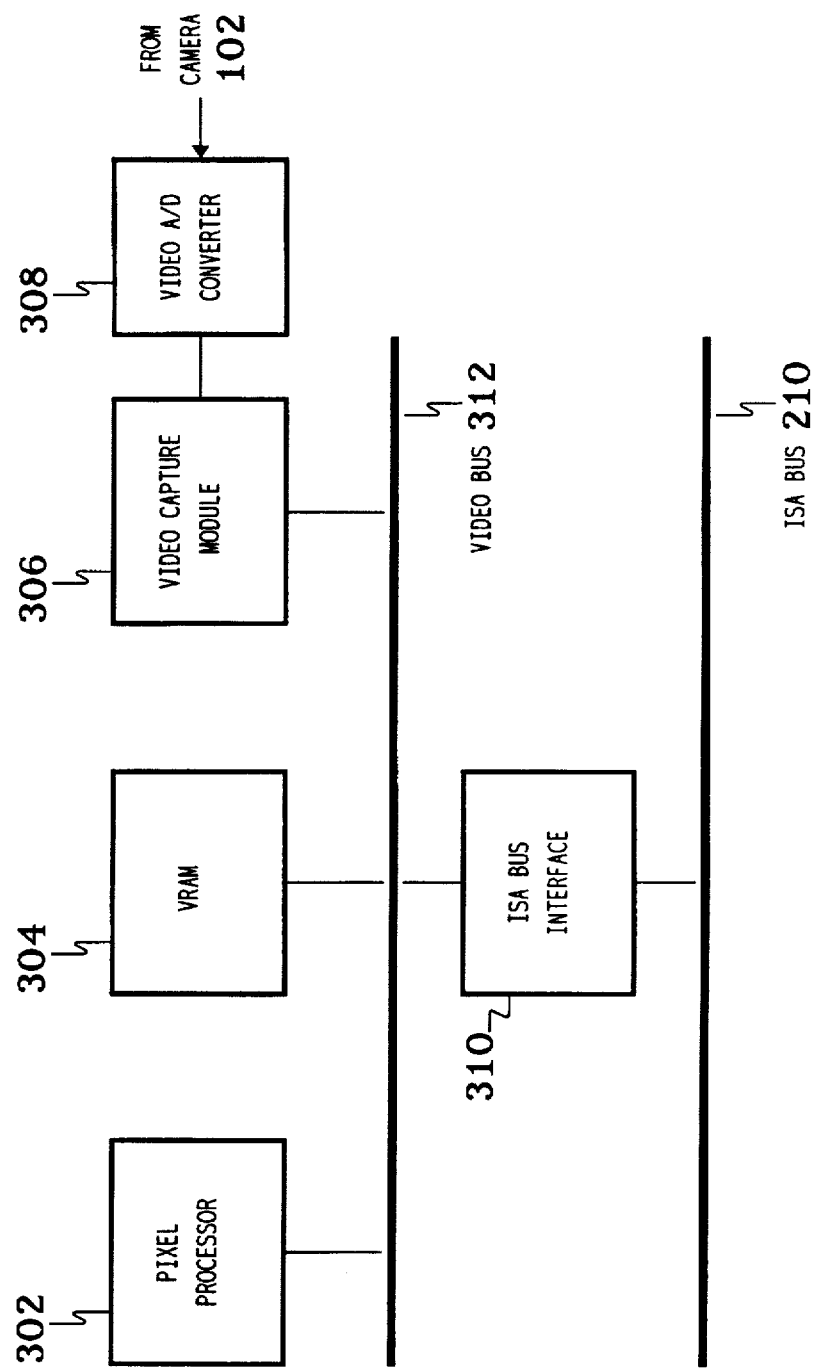
FIG. 3 is a block diagram of the hardware configuration of the video board of the PC system of FIG. 2.

Referring now to FIG. 3, there is shown a block diagram of the hardware configuration of video board 204 of PC system 100 of FIG. 2, according to a preferred embodiment of the present invention. Video board 204 comprises ISA bus interface 310, video bus 312, pixel processor 302, video random access memory (VRAM) device 304, video capture module 306, and video analog-to-digital (A/D) converter 308.

Video A/D converter 308 digitizes and decodes the analog video signals received from camera 102 and transmits the resulting digitized three-component (e.g., YUV) video signals to video capture module 306. Video capture module 306 captures and stores the digitized video signals as uncompressed digital video bitmaps to VRAM 304 via video bus 312. Pixel processor 302 compresses the uncompressed video bitmaps and stores the resulting compressed video signals back to VRAM 304. ISA bus interface 310 then transmits the compressed video signals via ISA bus 208 to PSTN interface 206 under the control of host processor 202.

Video A/D converter 308 of video board 204 may be any suitable means for digitizing and decoding analog video signals that are preferably NTSC or PAL standard video signals and is preferably a Philips video A/D converter. Video capture module 306 may be any suitable means for capturing digital video color component bitmaps and is preferably an Intel® SmartVideo™ Recorder. Video capture module 306 preferably captures video as subsampled 4:1:1 YUV bitmaps (i.e., U and V components subsampled by 4:1 ratio in two dimensions such that there are one U component and one V component for every (4×4) block of Y components). Memory 304 may be any suitable computer memory device for storing data during video processing such as a random access memory (RAM) device and is preferably a video RAM (VRAM) device with at least 1 megabyte of data storage capacity. Pixel processor 302 may be any suitable processor for compressing video data in real time and is preferably an Intel® pixel processor such as an Intel® i750® pixel processor or an Intel® Pentium™ processor. Video bus 312 may be any suitable digital communications bus and is preferably an Intel® PCI™ bus. ISA bus interface 310 may be any suitable interface between ISA bus 210 and video bus 312, and preferably comprises three Intel® ActionMedia® Gate Arrays and ISA configuration jumpers.

Video Signal Compression Processing

Figure 4:
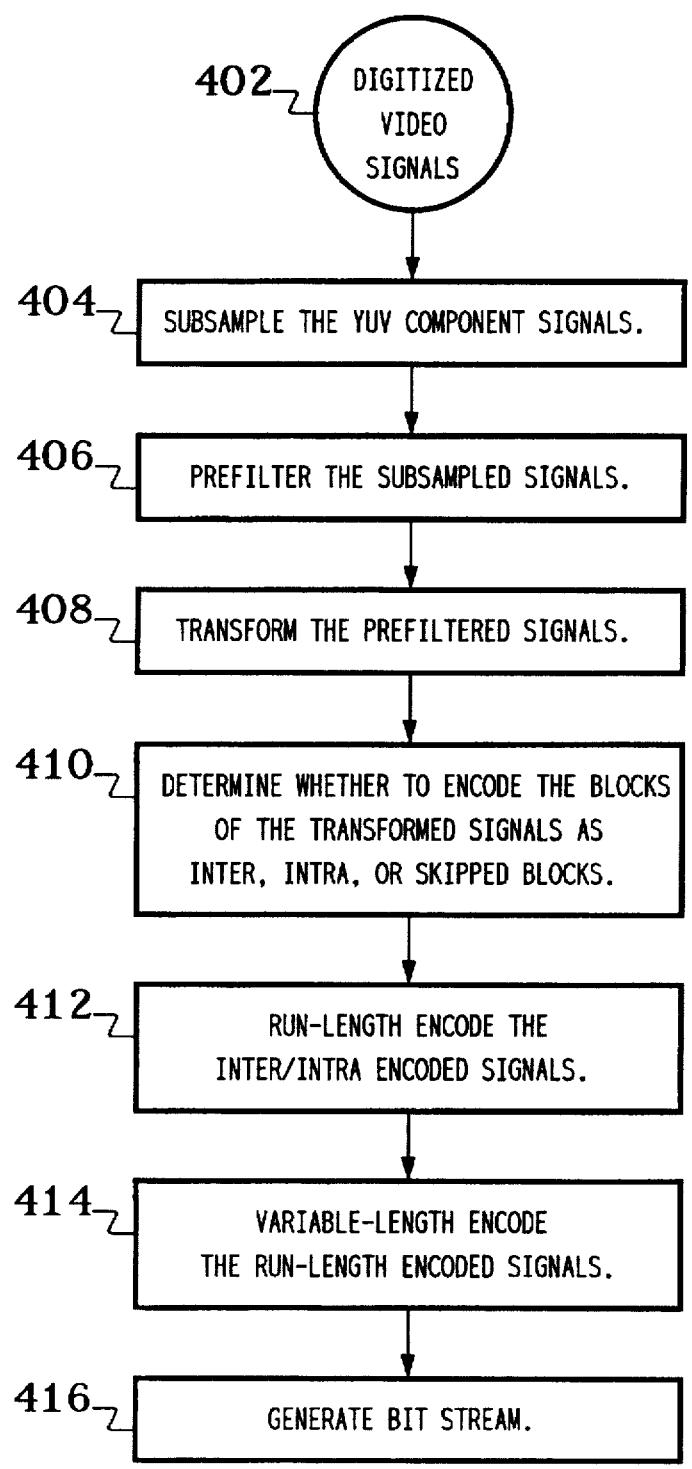
FIG. 4 is a process flow diagram of the video compression processing implemented by the PC system of FIG. 1.

Referring now to FIG. 4, there is shown a process flow diagram of the video compression processing implemented by PC system 100 of FIG. 1, according to a preferred embodiment of the present invention. Video signals are preferably sequences of frames, where the frames represent single pictures that are not interlaced. Frames may be generated from an interlaced camera output by dropping all even or all odd fields.

Video capture module 306 of video board 204 receives the digitized video signals from video A/D converter 308 (step 402 of FIG. 4) and subsamples the YUV component signals to generate subsampled 4:1:1 YUV signals (step 404). The dimensions (i.e., numbers of columns and rows) of each Y component plane of each video frame are preferably integer multiples of 8. If necessary, video capture module 306 adds U and V pixels to the right and bottom edges to generate U and V component planes that also have dimensions that are integer multiples of 8. It will be understood that these added pixels are preferably discarded in the decoding process.

The subsampled signals preferably have a centered spatial phasing wherein the location of each U and V pixel corresponds to the center of a (4×4) block of Y pixels. Alternative embodiments may implement other spatial phasing.

Figure 5:
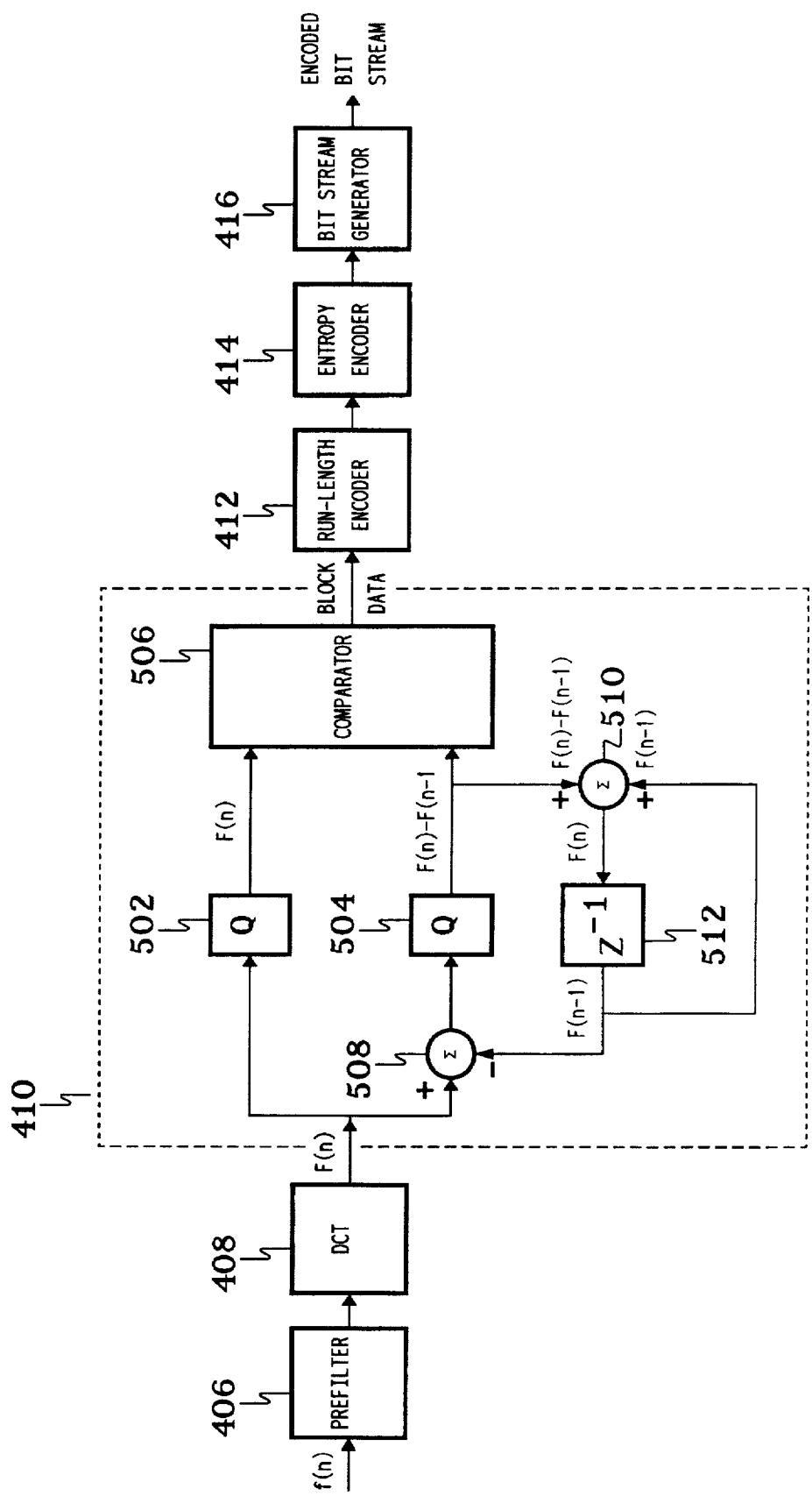
FIG. 5 is a block diagram of the encoder that implements the video compression processing of FIG. 4.

Referring now to FIG. 5, there is shown a block diagram of a preferred encoder, which is implemented on pixel processor 302 of FIG. 3. Prefilter 406 of FIG. 5 optionally prefilters the subsampled signals generated by video capture module 306 to reduce noise which would otherwise degrade the quality of the decoded images (step 406 of FIG. 4). Since noise typically requires additional bits to encode, reducing noise tends to increase the percentage of bits in a system with limited bandwidth that are used to encode useful information.

PC system 100 is preferably capable of implementing one of several prefiltering options, where the selection of which prefilter to implement may be based on the number of processor cycles available and/or the nature of the images. In a preferred embodiment, there are four prefiltering options, which are arranged below in order of increasing number of processor cycles required:

Option (1): No prefiltering;

Option (2): Temporal filtering;

Option (3): Temporal filtering plus copying; and

Option (4): Temporal filtering plus copying followed by spatial filtering.

It will be understood that the selection of a prefiltering option for a particular audio/video conferencing session may depend upon the processing capabilities of the PC systems used in the conferencing network and the video quality requirements of the participants.

Temporal filtering is preferably applied to regions of minimal or no detectable change to reduce noise in those regions. Spatial filtering is preferably applied to regions in which change is detected to reduce high spatial frequencies in those regions. It will be understood that spatial filtering makes the encoding of such regions easier (i.e., fewer bits required).

Temporal filtering plus copying involves temporally filtering the relatively unchanged regions of each frame while simply copying the changed regions without performing filtering.

Those skilled in the art will understand that temporal filtering and copying followed by spatial filtering (option #4) yields decoded video signals of the highest quality of the four prefiltering options listed above, but also requires the most processor cycles to implement. Similarly, temporal filtering plus copying (option #3) yields better quality, but requires more processor cycles, than temporal filtering alone (option #2). No prefiltering (option #1) requires the least number of processor cycles, but also produces the lowest quality results. The prefiltering of the present invention is described in further detail later in this specification in the section entitled "Prefiltering."

After prefiltering, DCT transformer 408 applies a forward discrete cosine transform (DCT) to each (8×8) pixel block of each component plane of each frame to generate a transformed signal comprising 64 DCT coefficients (step 408 of FIG. 4). The transformed signals are treated as two-dimensional DCT coefficient planes, where each (8×8) DCT coefficient block in the transform (i.e., frequency) domain is constructed from the 64 DCT coefficients generated by transforming the corresponding (8×8) pixel block in the image (i.e., spatial) domain.

Each (8×8) DCT coefficient block in the transform domain is to be encoded as either an inter block, an intra block, or a skipped block. An inter block is encoded based on the quantized differences between the DCT coefficients for the block of the current frame and the reconstructed quantized DCT coefficients for the corresponding block of the previous frame. An intra block is encoded without reference to any previous frame. A skipped block is encoded as being identical to the corresponding DCT coefficient block of the previous frame. In general, a frame may be encoded as a mixture of inter, intra, and skipped blocks, although some frames (e.g., reference frames) may be encoded using only intra blocks, and other frames (e.g., predicted frames) may be encoded using only inter and skipped blocks.

Figure 6:
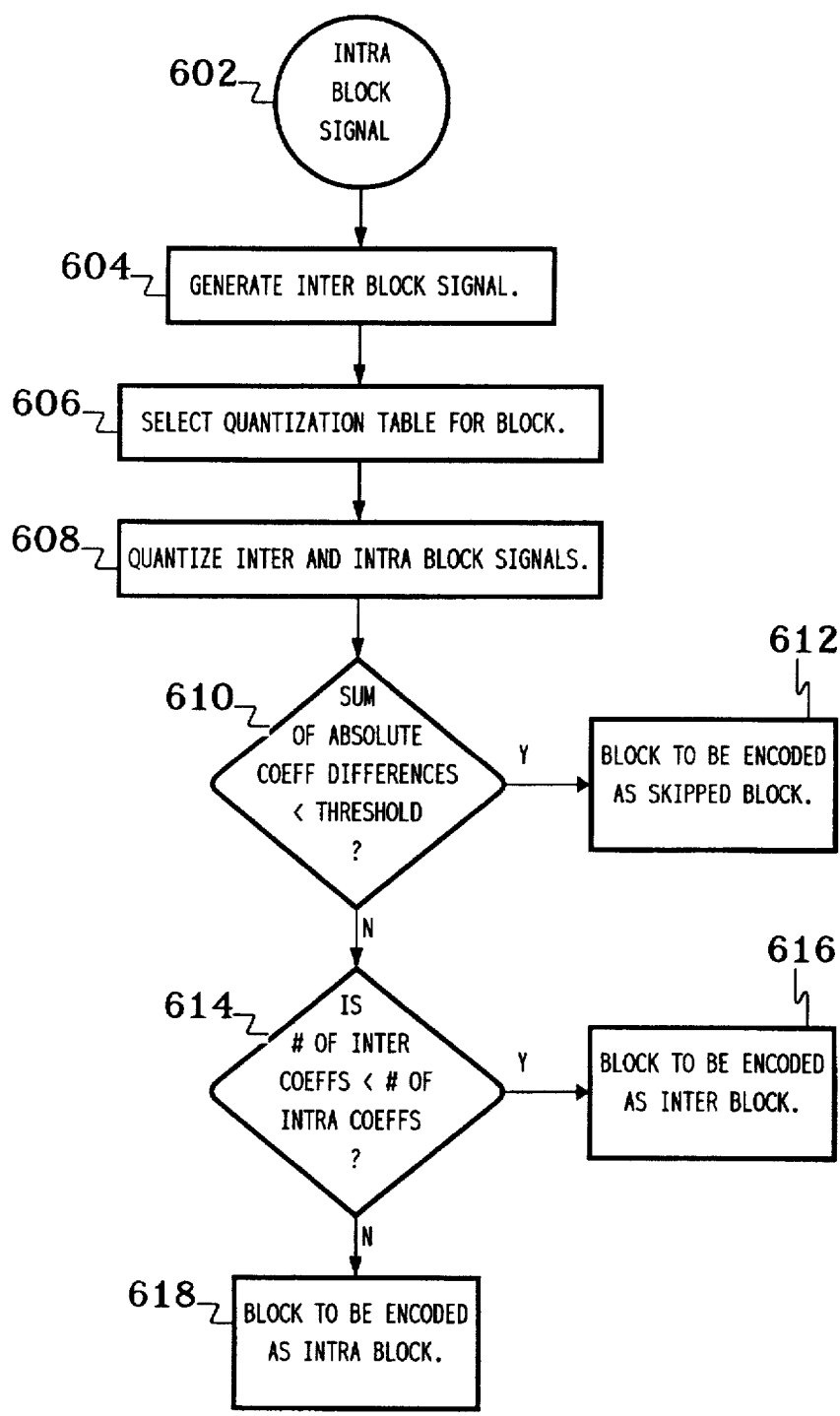
FIG. 6 is a process flow diagram representing the processing implemented by the encoder of FIG. 5 to determine whether to encode a block in the transform domain as an inter, intra, or skipped block.

Referring now to FIG. 6, there is shown a process flow diagram representing the processing implemented by pixel processor 302 to determine whether to encode a block of the DCT coefficients (i.e., the DCT transformed signal) as an inter, intra, or skipped block (step 410 of FIG. 4 and block 410 of FIG. 5), according to a preferred embodiment of the present invention. The current transformed signal (F(n) of FIG. 5) generated in step 408 of FIG. 4 is treated as an intra block signal (step 602 of FIG. 6).

Pixel processor 302 generates an inter block signal F(n)–F(n−1) by subtracting the reconstructed quantized DCT coefficients for the corresponding block of the previous frame (the previous transformed signal F(n−1) of FIG. 5) from the DCT coefficients for the current block of the current frame (the current transformed signal F(n)) using summation node 508 of FIG. 5 (step 604 of FIG. 6). The previous transformed signal F(n−1) is reconstructed using summation node 510 and delay node 512 of FIG. 5.

Pixel processor 302 then quantizes both the intra block signal F(n) and the inter block signal F(n)–F(n−1) using one of sixteen possible quantization tables using quantization nodes 502 and 504 of FIG. 5, respectively (steps 606 and 608 of FIG. 6). Each quantization table is an (8×8) block of quantizers. In quantization, each DCT coefficient (or DCT coefficient difference) is divided by the quantizer in the corresponding (8×8) block position and then either rounding to the nearest number or truncating the fractional part towards zero. As presented later in this specification in the section entitled "Quantization Tables," in a preferred embodiment, each quantizer of each quantization table is an integer power of two. This allows pixel processor 302 to perform quantization by simply shifting the DCT coefficient to the right by the appropriate corresponding integer power.

The intra and inter block signals for a given block may be quantized using different quantization tables. The selection of which quantization tables to use is part of the bit rate control in the compression processing of the present invention. Bit rate control is described in further detail later in this specification in the section entitled "Bit Rate Control."

The tables range in quantization coarseness from coarse (index 0) to fine (index 15). The tables are designed so that the table having index 8 produces roughly a specified target bit rate for a typical video sequence, table 0 produces less than half of the target bit rate, and table 15 produces more than double the target bit rate.

After the inter block and intra block signals are quantized using quantization blocks 502 and 504 of FIG. 5 (step 608 of FIG. 6), the pixel processor 302 compares the quantized signals using comparator 506 of FIG. 5 to determine how to encode the current block.

In many video scenes, nearly imperceptible low-frequency noise may occur as a result of poor artificial lighting and strobing (i.e., temporally varying illumination from lights powered by AC currents) in busy background scenery. If not removed in some intelligent fashion by the encoder, the noise may be automatically coded and sent to the receiver. This may occur even though the noise may possibly consume large quantities of coding resource and is generally an unnatural and perceptually unnecessary component of the scene being photographed.

Comparator 506 of FIG. 5 applies a dead-band filter to filter the low-frequency noise by employing a simple, non-linear decision on whether a given image block is changing its composition at a rate indicating the presence of real video information or noise. The dead-band filter determines whether or not to encode a block of a video frame as a skipped block. If the sum of the absolute values of the quantized DCT coefficient differences (i.e., the sum of the absolute values of the signals generated by quantization node 504 of FIG. 5) for a given block is less than a specified dead-band threshold (step 610 of FIG. 6), then the changes in composition are determined to be due to noise and the block is to be encoded as a skipped block (step 612). In a preferred embodiment, the dead-band filter is based on a weighted sum, where low-frequency DCT coefficients are weighted more heavily than high-frequency DCT coefficients.

The dead-band filter works on the assumption that low-frequency noise does not significantly change the composition of a given block in one time interval. If the block composition is changing as a result of an information source, like movement, then the sum will exceed the dead-band threshold within one or two time intervals.

An advantage of the dead-band filter over conventional filtering is that it may be implemented using fewer operations. A separable, n-tap filter for an (N×N) block of values typically uses on the order of $2n(N^2)$ operations with most of them being multiplications. The dead-band filter uses approximately N+1 operations (N additions and one compare-and-branch).

Otherwise, the sum generated in step 610 is not less than the dead-band threshold and processing continues to step 614. If the number of inter block coefficients (i.e., the number of non-zero quantized DCT coefficient differences) is less than the number of intra block coefficients (i.e., the number of non-zero quantized DCT coefficients) (step 614), then the block is to be encoded as an inter block (step 616). Otherwise, the block is to be encoded as an intra block (step 618). Those skilled in the art will understand that other tests based on other measures may be used to determine when to encode blocks as skipped, inter, or intra.

If a block is to be encoded as a skipped block, then a short unique code in the encoded bit stream may be used to designate the block as a skipped block. The decoder will then know to copy the corresponding (8×8) block of DCT coefficients from the previous decoded frame.

If a block is to be encoded as an intra block or an inter block, run-length encoder 412 of FIG. 5 linearizes the (8×8) block of quantized signals and then run-length encodes the linearized signal (step 412 of FIG. 4). In a preferred embodiment, the linearization of (8×8) blocks follows the zig-zag scan sequence of FIG. 7, where the quantized DCT coefficients are arranged such that the lowest frequency DCT coefficient (i.e., the DCT DC coefficient) is at the upper left corner and the highest frequency DCT coefficient is at the lower right corner.

For intra blocks, run-length encoding transforms each (8×8) block of quantized DCT coefficients into a linear array of run-length-encoded DCT coefficient signals. The first value in the linear array corresponds to the quantized DCT DC coefficient. Following the DC value are a sequence of pairs of values, where each pair comprises a run value representing the number of consecutive quantized DCT coefficients having a value of zero and a coefficient value representing a quantized DCT coefficient having a non-zero value.

For inter blocks, run-length encoding transforms each (8×8) block of quantized DCT coefficient differences into a linear array of run-length-encoded DCT coefficient difference signals. For typical inter blocks, the quantized DCT coefficient difference corresponding to the DCT DC coefficient is zero. As such, the run-length-encoded linear array for inter blocks starts with a sequence of pairs of values, where each pair comprises a run value representing the number of consecutive quantized DCT coefficient differences having a value of zero and a coefficient value representing a quantized DCT coefficient difference having a non-zero value.

These preferred run-length encoding schemes take advantage of the fact that, for typical video images, after DCT transformation and quantization, there are few non-zero quantized DCT coefficients and they are usually distributed in the upper left corner of the (8×8) block of FIG. 7 (i.e., they tend to be low frequency). The result is run-length encoding that produces a small number of pairs of run values and coefficient values, with a long run of quantized DCT coefficients (or quantized DCT coefficient differences) having a value of zero at the end of the block. In a preferred embodiment, an special end of block (EOB) value is used to indicate that the rest of the quantized DCT coefficients (or quantized DCT coefficient differences) in the block are zero.

In order to take advantage of the different frequencies with which different run values and coefficient values occur, entropy encoder 414 of FIG. 5 further encodes the run-length-encoded signals using variable-length coding (VLC) (also known as entropy encoding) (step 414 of FIG. 4). In VLC, more common values are encoded using shorter code words. Entropy encoder 414 uses a set of code tables to transform the run-length-encoded signals into VLC signals comprising a series of VLC code words. For maximum compression the code tables are preferably optimized for the actual signals being processed. In practice, the code tables may represent a compromise between different types of typical expected signals.

In a preferred embodiment, the selected VLC code table may be switched based on the type of signal being processed. VLC code tables are constructed such that every VLC code is unique and immediately recognizable. As such, no separators are required to separate the VLC codes.

Entropy encoder 414 may use one VLC code table to encode the run values and another VLC code table to encode the coefficient values. VLC code table selection may also depend on the context (e.g., whether the frame is a mixed frame, predicted frame, or reference frame). Different VLC code tables may also be used for first run values and for subsequent run values in a block. Similarly, different code tables may be used for DCT DC coefficients and for DCT AC coefficients.

In a preferred embodiment of the present invention, all VLC codes are 14 bits long or less to facilitate processing by 16-bit processors and to reduce memory storage requirements. In some of the code tables, the longest VLC codes are less than 14 bits long. When values may be either positive or negative, a sign bit is appended to the VLC code. For example, a 0 at the end of a VLC code may represent a negative value and a 1 at the end of a VLC code may represent a positive value.

In a preferred embodiment, the block types (i.e., skipped, intra, or inter) for the blocks of each frame are also run-length and variable-length encoded. In this embodiment, VLC codes for all of the blocks of a frame precede the VLC codes for the quantized DCT coefficients for that frame. Run-length encoding of block types is described in further detail later in this specification in conjunction with FIGS. 21 and 22.

In an alternative preferred embodiment, the block types are interspersed with the VLC codes for the quantized DCT coefficients. Those skilled in the art will understand that the former embodiment may result in greater compression, while the latter embodiment may reduce decode processing delay.

Bit stream generator 416 of FIG. 5 then generates the encoded bit stream using the VLC codes and certain control information for the bit stream headers (step 416 of FIG. 4). The bit stream syntax is described in further detail later in this specification in conjunction with FIGS. 17–19.

Prefiltering

Some conventional video filtering techniques rely on low-pass spatial filtering. Such low-pass spatial filtering has the disadvantage of not being able to remove all noise, for example, low frequency flicker or slight frame-to-frame variations. Conventional video temporal filtering may remove such noise, but is not generally used since it often produces unacceptable motion blur and ghosting. More sophisticated systems find the optical flow and filter along the lines of motion. These latter systems are too complex to be implemented in real time using inexpensive hardware.

The current invention offers an inexpensive way for removing random noise from stationary areas in a video sequence and for reducing the spatial information present in moving or otherwise changing areas. The filtering of the current invention may reduce the bit rate for a given video quality and/or improve the video quality at a constant bit rate.

The temporal and spatial prefilters of the present invention remove noise from the source video signals yielding higher visual quality. They also remove spatial information not needed by video encoders. As a result, useful video information may be compressed more accurately giving perceptibly higher visual quality at the decoder.

As described earlier in this specification in conjunction with step 406 of FIG. 4, PC system 100 implements one of the following four prefiltering options depending on the number of processor cycles available:

Prefiltering Option (1): No prefiltering;

Prefiltering Option (2): Temporal filtering;

Prefiltering Option (3): Temporal filtering plus copying; and

Prefiltering Option (4): Temporal filtering plus copying followed by spatial filtering.

Prefiltering Option (4) consists of a non-linear temporal filter followed by a non-linear spatial filter. The temporal filter eliminates noise in stationary areas of the frame. Since the paradigm for video conferencing uses a fixed camera, it is expected that a significant part of each frame will consist of a stationary background.

The temporal filtering generates some artifacts around moving objects. To remove these artifacts, regions of motion are detected and a non-linear edge-preserving spatial low-pass filter is applied to the source video. The effect of this spatial filtering is to remove the artifacts around moving objects, and to reduce high spatial frequencies in regions of movement. These spatial frequencies are difficult to code and may be later rejected in the coding process in a less satisfactory way by discarding DCT coefficients.

The filtering of the present invention is preferably applied first to the Y plane. The information regarding which regions of the Y plane contain movement or change may then be used to apply the filtering to the U and V planes.

Temporal filters reduce background noise. To minimize the entropy code size, a non-linear filter with a threshold is preferably used. To reduce the induced noise in moving regions, such pixels are changed to within one threshold of the source and not to the source value.

A temporal prefilter according to a preferred embodiment of the present invention (i.e., a preferred embodiment of Prefiltering Option (2)) is a non-linear temporal filter that may be represented by the following pseudo-code:

```
for each pixel
{
  if (source>(stored+noise threshole))
    then filtered=source-noise threshold
  else if (source<(stored-noise threshold))
    then filtered=source+noise threshold
  else filtered=stored
}
``` where "source" refers to the original value of the pixel in the current frame, "stored" refers to the value of the pixel in a reference frame, "noise threshold" is a selected threshold value, and "filtered" refers to the filtered value for the pixel in the current frame. In a preferred embodiment, the filtered image becomes the stored reference frame used to filter the next frame. The noise threshold may be selected empirically off line using test video sequences similar to those to be processed in real time. A typical value for the noise threshold is 4 out of 256 levels, but this depends upon the type of camera used.

This temporal prefilter may produce some visible artifacts. For example, moving objects may leave residues that persist until another local change occurs. In addition, initial noise may get frozen and not decay. One solution is to make the temporally-filtered pixels converge to the long-term moving average. To avoid significantly increasing the entropy code size, the convergence process preferably has the following characteristics:

The convergence is relatively slow.

The filtered pixel values do not oscillate.

The filtered pixel values do not change if the long-term average (out of 256 levels) is 0.5 or less away.

These characteristics may be achieved by accumulating errors for each pixel. The error in each frame is the value of the source pixel minus that of the stored pixel. In the error for any pixel accumulates in one direction, then the value of the stored pixel is adjusted so as to reduce the error.

The following pseudo-code represents a temporal prefilter according to an alternative preferred embodiment of the present invention (i.e., an alternative preferred embodiment of Prefiltering Option (2)) designed to achieve these objectives. This pseudo-code corresponds to the pseudo-code for the previously described temporal prefilter with the addition of code designed to accumulate the errors and change the stored values depending on the nature and size of the accumulated errors.

```
for each pixel
{
  if (source > (stored + noise threshold))
    then, {
      filtered = source - noise threshold
      error = 0
    }
  else if (source < (stored - noise threshold))
    then {
      filtered = source + noise threshold
      error = 0
    }
  else {// change is within noise threshold
    error = error + (source - stored)
    if (error > convergence threshold)
    then {
      \\ change the stored value by 1
      filtered = stored + 1
      \\ reset error
      error = 0
    }
    else if (error < -(convergence threshold))
    then {
      \\ change the stored value by 1
      filtered = stored - 1
      \\ reset error
      error = 0
    }
    else {
      filtered = stored
      \\ decrement error by a small amount
      \\ to decay error to avoid oscillation
      |error|=|error| - y
    }
  }
}
``` where "error" is a running error measure and "convergence threshold" is a selected threshold value.

The stored error is reduced with time so that random errors with a long-term DC average of less than 0.5 do not cause a change in the stored value. This may be accomplished using different methods. In a first preferred method, twice the current error is added to the stored error. If the stored error is not zero, then the magnitude of the stored error is reduced by 1. In a second preferred method, the current error is added to the stored error and, on alternate frames, the magnitude of the stored error is reduced by 1.

The convergence threshold may be selected empirically off line using test video sequences similar to those to be processed in real time. A typical value for the convergence threshold is three times the noise threshold.

The long-term convergence of the temporal prefilters described above may not remove short-term visible artifacts produced by changes or moving objects (e.g., a white shirt exposing a dark background may leave a ghostly outline). This problem is preferably solved by detecting change in a region and then replacing the stored image by the source image within that region (i.e., copying). Change detection may be accomplished, for example, by counting the number of pixels that change or by summing the absolute values of the changes. In a preferred embodiment, if a specified fraction (e.g., ¼) of the pixels in a region have changed by more than the noise threshold, then the region is said to have changed. The following pseudo-code represents a preferred filter according to Prefiltering Option (3), which implements the temporal filtering of the alternative embodiment of Prefiltering Option (2) described previously, plus copying of pixels for regions of change:

```
for each block
{
  change count = 0
  for each pixel in the block
  {
    if (source > (stored + noise threshold))
    then {
      filtered = source - noise threshold
      error = 0
      change count = change count + 1
    }
    else if (source < (stored - noise threshold))
    then {
      filtered = source + noise threshold
      error = 0
      change count = change count + 1
    }
    else {\\ change is within noise threshold
      error = error + (source - stored)
      if (error > convergence threshold)
      then {
        \\ change the stored value by 1
```

```
            filtered = stored + 1
            \\ reset error
            error = 0
            }
        else if (error < -(convergence threshold))
        then {
            \\ change the stored value by 1
            filtered = stored - 1
            \\ reset error
            error = 0
            }
        else {
            filtered = stored
            \\ decrement error by a small amount
            \\ to decay error to avoid oscillation
            |error| = |error|- y
            }
        }
    }
    if (change count > change count threshold)
    then {
        \\ copy the source block to the destination
        for each pixel in the block
        {
            filtered = source
        }
    }
}
``` where "change count" is a running counter of the number of pixels in the current block that have changed with respect to the reference frame and "change count threshold" is a selected threshold value. The change count threshold may be selected empirically off line using test video sequences similar to those to be processed in real time. A typical value for the change count threshold is one-quarter of the pixels in the region. If the change count exceeds the change count threshold, then the block is said to be a changed block. In that case, the previously performed temporal filtering is ignored and copying is implemented. Those skilled in the art will understand, therefore, that as soon as the change count exceeds the change count threshold, the temporal filtering for the current block may be terminated.

It is desirable to spatially filter a region of change in order to reduce noise and improve the final quality. Spatial filtering is appropriate when neighboring pixels can be correlated with one another. For example, it may be appropriate to apply a spatial filter to regions of uniform color (e.g., a blue sky), where differences between neighboring pixels are probably due to noise. On the other hand, it may not be appropriate to apply a spatial filter to regions wherein the values of neighboring pixels are not well correlated (e.g., foliage). In such regions, differences between neighboring pixels represent actual signal differences rather than noise. Spatial filtering may eliminate such differences which should be preserved.

In order to avoid the problems associated with transitions between changed regions and unchanged regions, the spatially filtered pixels may be adjusted so that they do not differ by more than a specified threshold value from the source pixels. This may be accomplished in at least the following two ways:

Apply a linear spatial filter and then compare the spatially filtered pixels to the source pixels.

Apply a non-linear spatial filter where each adjacent pixel can contribute only up to the threshold difference to the pixel being spatially filtered.

In a preferred embodiment of Prefiltering Option (4), a linear spatial filter (e.g., a 1-2-1 low-pass filter) is applied to the copied regions of Prefiltering Option (3). The spatially filtered pixels are then compared to the unfiltered source pixels. If the magnitude of the difference between a spatially filtered pixel and the corresponding unfiltered source pixel is less than the noise threshold value, then the differences between the adjacent pixels are assumed to be due to noise and the spatially filtered pixel value is retained. Otherwise, the pixel differences are assumed to be due to true signal differences. In that case, the filtered pixel is set to a value not more than a noise threshold away from the unfiltered source pixel value. The following pseudo-code represents this preferred embodiment of Prefiltering Option (4):

```
for each block
{
    change count = 0
    for each pixel in the block
    {
        if (source > (stored + noise threshold))
        then {
            filtered = source - noise threshold
            error = 0
            change count = change count + 1
        }
        else if (source < (stored - noise threshold))
        then {
            filtered = source + noise threshold
            error = 0
            change count = change count + 1
        }
        else {\\ change is within noise threshold
            error = error + (source - stored)
            if (error > convergence threshold)
            then {
                \\ change the stored value by 1
                filtered = stored + 1
                \\ reset error
                error = 0
            }
            else if (error < -(convergence threshold))
            then {
                \\ change the stored value by 1
                filtered = stored - 1
                \\ reset error
                error = 0
            }
            else }
                filtered = stored
                \\ decrement error by a small amount
                \\ to decay error to avoid oscillation
                |error| = |error| - y
            }
        }
    }
    if (change count > change count threshold)
    then {
        \\ copy the source block to the destination
        for each pixel in the block
        {
            filtered = source
        }
        \\ spatially filter the copied block
        for each pixel in the block
        {
            apply linear spatial filter to pixel
            \\ clamp the spatially filtered pixels
            if (filtered - source) > noise threshold
            then {
                filtered = source + noise threshold
            }
            else if (filtered - source) < -(noise threshold)
            then {
                filtered = source - noise threshold
            }
        }
    }
}
```

Those skilled in the art will understand that the spatial filtering of Prefiltering Option (4) is computationally cheaper than a non-linear spatial filter that compares adjacent pixels before determining whether to filter spatially.

Those skilled in the art will understand that the discussion of prefiltering options is arranged in increasing image quality and also increasing number of processor cycles required. The encoder preferably selects the prefiltering option that provides the greatest image quality based on the number of processor cycles available. Those skilled in the art will also understand that the temporal and spatial filters of the prefiltering of the present invention may be implemented in various alternative ways.

Figure 8:
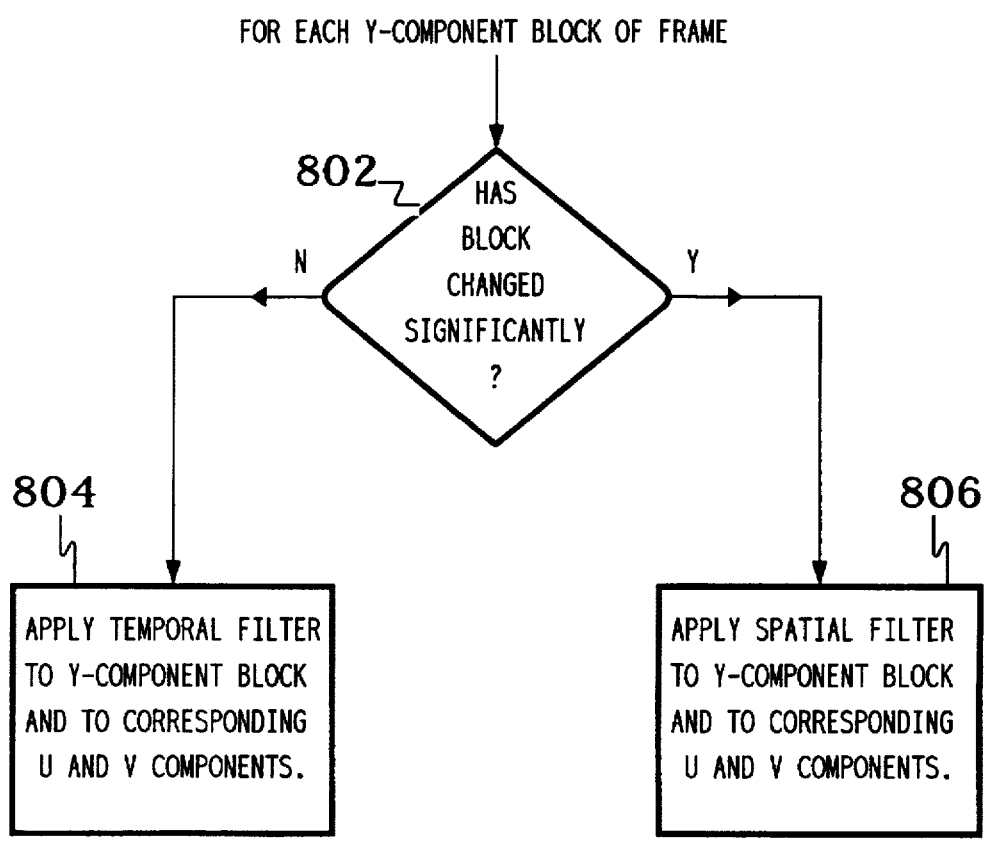
FIG. 8 is a process flow diagram that summarizes Prefiltering Option (4) of the present invention.

Referring now to FIG. 8, there is shown a process flow diagram that summarizes Prefiltering Option (4) of the present invention. For each block of Y components of each frame, if the changes from the corresponding block of the previous frame are not significant (step 802 of FIG. 8), then the block is determined to be relatively unchanged and temporal filtering is applied to the Y-component block and to the corresponding U and V components of the current frame (step 804). Otherwise, the block is determined to be relatively changed and spatial filtering is applied to the Y-component block and to the corresponding U and V components of the current frame (step 806).

Those skilled in the art will understand that prefiltering may be implemented by writing the filtered values over the same locations in memory as the original frame or by creating a distinct filtered frame in memory.

Bit Rate Control

While the transmission rate of PSTN connection 110 of FIG. 1 may be fixed, the PSTN transmission bandwidth allocated to the transfer of video signals may depend upon what other signals are being transmitted over the PSTN connection (e.g., audio, control). Moreover, PC system 100 may produce a compressed video signal that has a different number of bits for each frame of the video sequence. Under these circumstances, PC system 100 preferably implements bit rate control to monitor and adjust the encoding processing to meet the transmission bandwidth limitations of the PSTN connection. This bit rate control is based on a target bit allocation (or target bit rate) for the current frame. The target bit allocation may be a function of the transfer rate of the transmission system (e.g., the transmission bandwidth of the PSTN network 100 of FIG. 1) and the channel capacity (e.g., the portion of the PSTN network 100 allocated to video). The current bit allocation may also be affected by the amount by which previous frames exceeded the target bit allocation.

According to a preferred embodiment, bit rate control for PC system 100 comprises primary bit rate control and secondary bit rate control. Primary bit rate control involves the selection of quantization tables used for encoding the blocks of video signals, where the use of coarser quantization tables implies using few bits to encode but at the cost of video quality. Secondary bit rate control involves the dropping of frames from the video stream. The secondary bit rate control is preferably a back-up mode in case the primary bit rate control is insufficient. PC system 100 may also employ both types of bit rate control simultaneously.

Primary Bit Rate Control

Primary bit rate control involves the selection of the quantization tables used in encoding the blocks of video frames (step 606 of FIG. 6). One method of bit rate control assumes that the number of bits used to encode each region of a video frame is constant over the frame. As such, a single quantization level may be selected for the entire frame.

The selection of quantization level may be based on a characterization of the complexity of the frame (e.g., based on the sum of the absolute values of the DCT coefficients). Knowing the complexity of the previous frame, the quantization level used to encode the previous frame, and the resulting number of bits used to encode the previous frame, the quantization level for the current frame may be selected by comparing the complexity of the current frame to the complexity of the previous frame and taking into account the number of bits used to encode the previous frame relative to the target bit rate.

The goal of such a bit rate control may be to minimize the total mean square error over the entire frame. Such a strategy may be appropriate for encoding video sequences comprising scene changes and where motion may occur in any region of the frame.

In the video conferencing paradigm, however, scene changes may be rare or even nonexistent and motion tends to be concentrated in particular regions of the images (e.g., the center of the frame containing conference participants), while other regions containing background scenes may change infrequently, if at all. Moreover, the human eye is more sensitive to coding errors in different types of video scenes. For example, the human eye is more sensitive to coding errors in smooth or uniform regions (e.g., monochrome walls) than in regions of high random detail (e.g., foliage). Similarly, the human eye is more sensitive to coding errors in regions of stationary uniform detail (e.g., striped wallpaper) than in regions of motion (e.g., person moving across a room). As such, overall video quality is improved by using finer quantization to encode those regions to which the human eye is more coding-error sensitive (thereby preserving more detail) than is used for those regions to which the human eye is less coding-error sensitive.

In a preferred embodiment, therefore, the video frames are divided into regions, where each region may be encoded using a different quantization table. The bit rate control keeps track of the total number of bits used to encode each region of a frame. The bit rate control assumes that each region of the next frame will be encoded using a similar number of bits as for the corresponding region of the previous frame.

The quantization level used to encode each region may be based on a measure of the complexity of the region. Where a region corresponds to a block of the video frame, the complexity measure is preferably a weighted sum of the absolute values of the DCT coefficients for that block, where the weighting emphasizes the high-frequency DCT coefficients over the low-frequency DCT coefficients.

The quantization level Q for the current region of the current frame is preferably selected using Equation (1) as follows:

$$Q = Q_{ave} * \frac{(C_{ave} + R * C)}{(R * C_{ave} + C)}, \tag{1}$$

where C is the complexity of the current region, $C_{ave}$ is the average complexity for the current frame, $Q_{ave}$ is the average quantization level for the current frame, and R is a specified constant (preferably with a value of approximately 2). Such a formula allows the quantization levels to vary from block to block over each frame, where the constant R determines the magnitude of the allowable variation.

Figure 9:
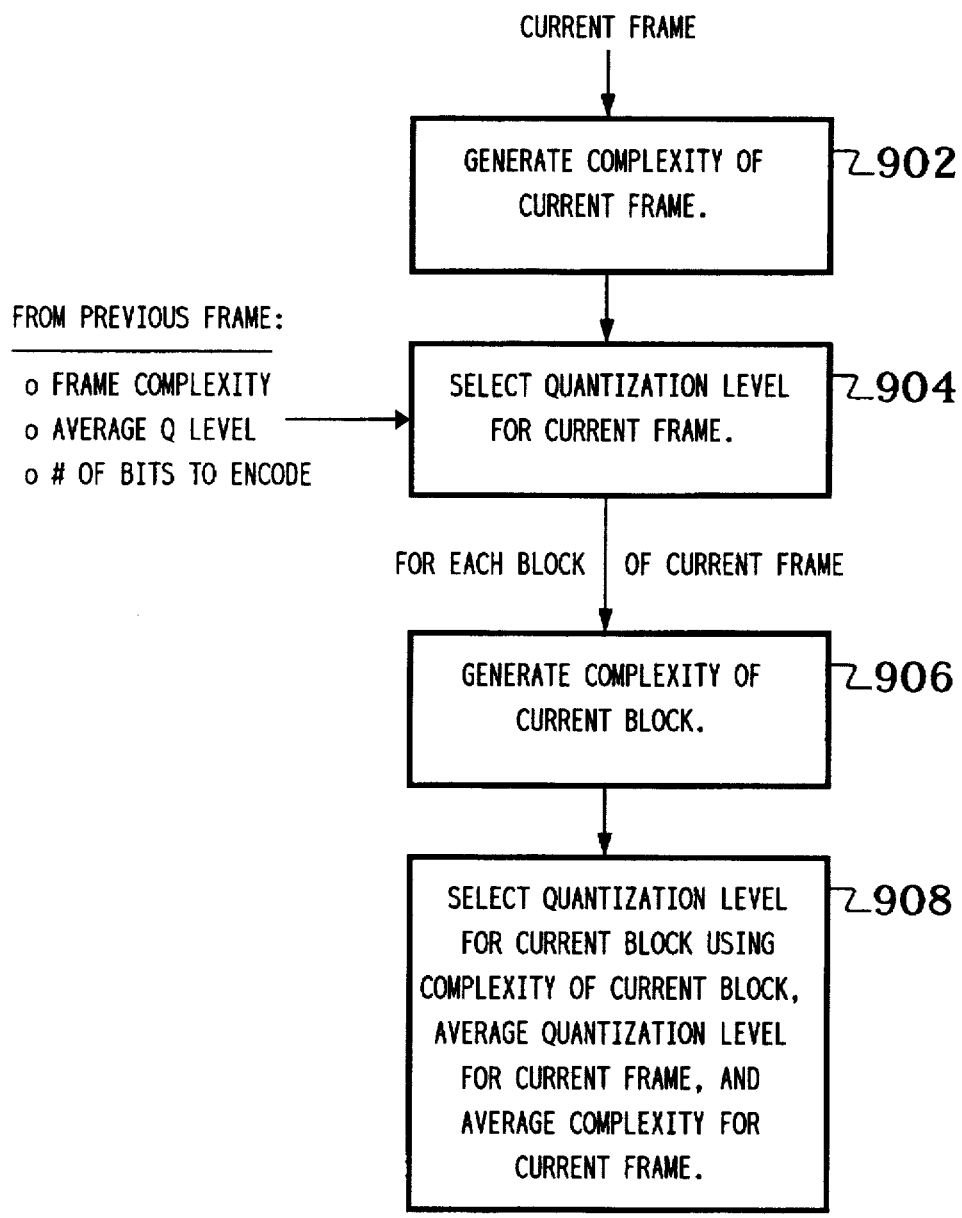
FIGS. 9–12 are process flow diagrams for selecting the quantization level on a block-by-block basis, according to preferred embodiments of the present invention.

Referring now to FIG. 9, there is shown a process flow diagram for selecting the quantization level on a block-by-block basis, according to the preferred embodiment of the present invention represented in Equation (1). For each frame, the complexity of the frame is generated (step 902 of FIG. 9). As described above, a quantization level for the current frame is then generated using the complexity of the current frame, the complexity of the previous frame, the average quantization level of the previous frame, and the number of bits used to encode the previous frame (step 904). For each block of the current frame, a block complexity is generated (step 906) and then used with the average quantization level of the current frame and the average complexity of the current frame to select the quantization level for the current block (step 908).

In the preferred embodiment of FIG. 9, the average complexity $C_{ave}$ and the average quantization level $Q_{ave}$ are determined using the procedure outlined above for the selection of a single quantization level for each frame. Those skilled in the art will understand that such an embodiment introduces a processing delay in order to generate the average complexity and average quantization level for the entire current frame.

Figure 10:
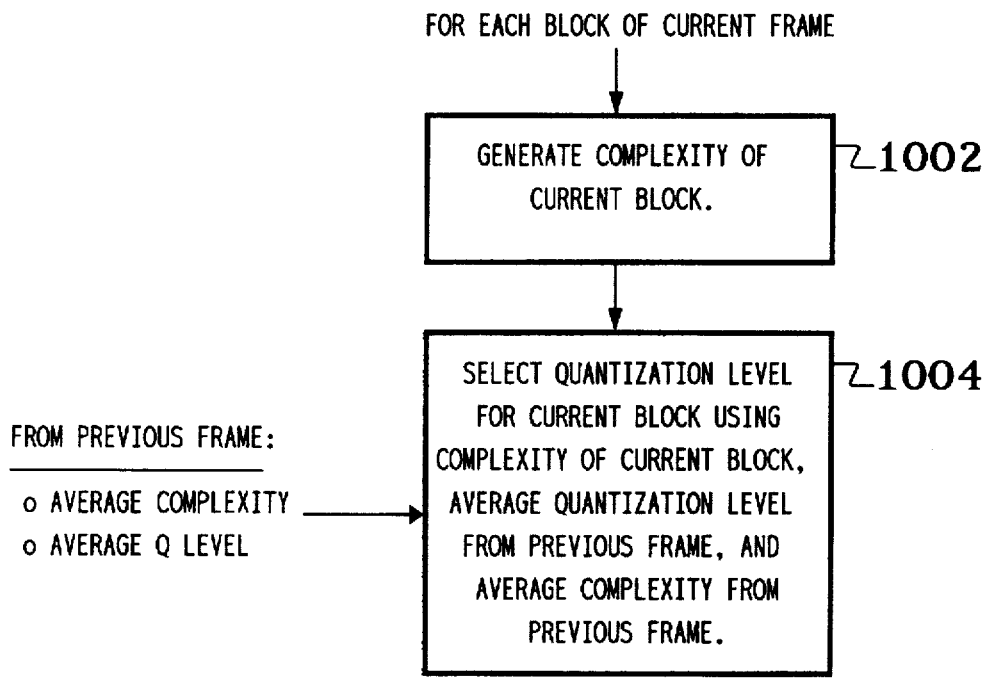

In an alternative preferred embodiment shown in FIG. 10, the complexity of the current frame is assumed to be similar to the complexity of the previous frame. In this embodiment, the average complexity $C_{ave}$ and the average quantization level $Q_{ave}$ used in Equation (1) are those calculated for the previous frame. Thus, after generating the complexity of the current block (step 1002 of FIG. 10), the quantization level for the current block is selected using the complexity of the current block, the average quantization level from the previous frame, and the average complexity from the previous frame (step 1004). Although this embodiment avoids the aforementioned processing delay, encoding inefficiencies may result when the assumption that the complexities of the previous and current frames are similar breaks down.

In a preferred embodiment, the different quantization levels for the blocks of each frame are explicitly encoded in the encoded bit stream. Those skilled in the art will understand that this may be impractical in transmission systems with low bandwidth.

Figure 11:
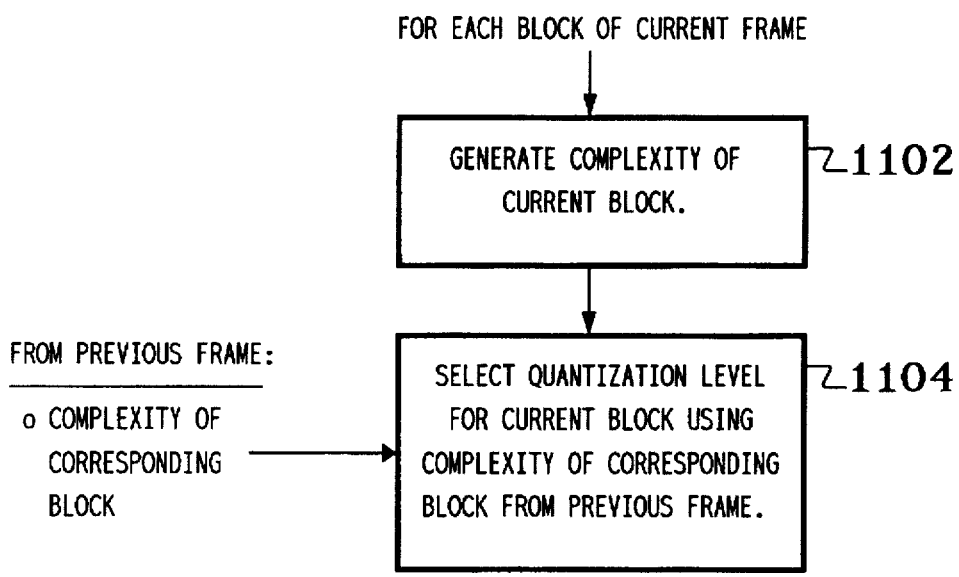

In an alternative preferred embodiment as shown in FIG. 11, where the structure of the current image is assumed to be similar to that of the previous image, the complexities of the blocks of the current frame are used to select the quantization levels for the corresponding blocks of the next frame. That is, the quantization level for a block of the current frame is selected using the complexity of the corresponding block of the previous frame (step 1104 of FIG. 11) and the complexity of the current block is generated to use in encoding the next frame (step 1102). From the decoder's point of view, the complexities of the decoded blocks for the current frame are used to select the quantization levels to decode the blocks of the next frame. In such an embodiment, there is no need for the quantization levels to be explicitly encoded in the bit stream.

Figure 12:
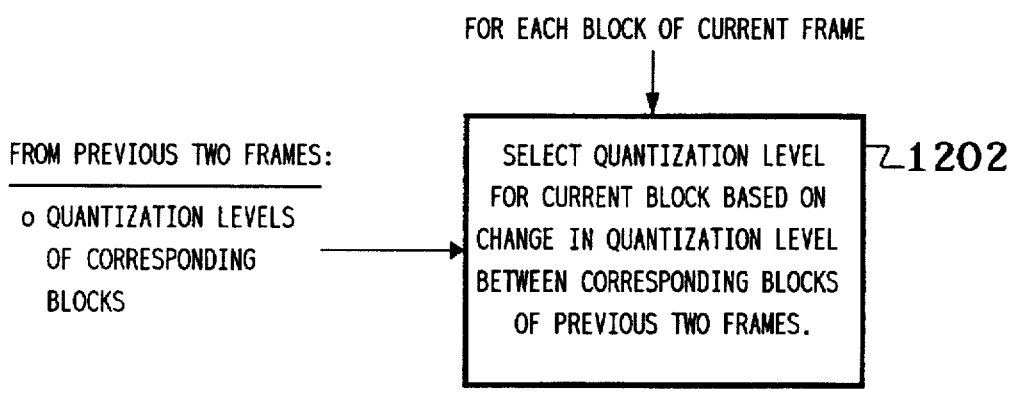

In conventional bit rate control, when the quantization level changes from frame i to frame i+1 from level $Q_i$ to level $Q_{i+1}$, the bit rate control assumes that the quantization level for frame i+2 will also be level $Q_{i+1}$. In a preferred embodiment of the present invention of FIG. 12, the primary bit rate control uses the rate of change in quantization level for a particular region from frame i to frame i+1 to determine the assumed quantization level for frame i+2 (step 1202 of FIG. 12). The quantization level $Q_{i+2}$ for frame i+2 is assumed to be as follows:

$$Q_{i+2}=Q_{i+1}+f(Q_{i+1}-Q_i),$$

where $f$ is a function of the change in quantization level over the previous two frames. This bit rate control assumes that the rate of change in the complexity of a video sequence will continue from frame to frame. This may occur in the video conferencing paradigm, for example, where the change in complexity corresponds to a person entering the field of view of the camera. As more and more of the person's body becomes part of the video frame, the video complexity will continue to increase over a sequence of video frames.

Those skilled in the art will understand that such a bit rate control scheme will also tend to prevent the drastic measure of frame dropping implemented by the secondary bit rate control by reducing the fullness of the transfer buffer in the channel model (described in the next section).

Secondary Bit Rate Control

The secondary bit rate control involves the maintenance of a channel model for a transmitter with a fixed-length transmit buffer. An encoded frame may be transmitted only if there is sufficient room in the transmit buffer. Otherwise, the frame is dropped and the encoder does not update its own accumulator. The channel model also preferably keeps track of the past performance of the encoder and varies the target bit rate that the encoder uses to select which quantization table to use. Similarly, the receiver in the channel model reads data from the channel at a fixed rate and only decodes a frame from the video sequence when all of the data associated with the frame has arrived.

Video Signal Decompression Processing

Figure 13:
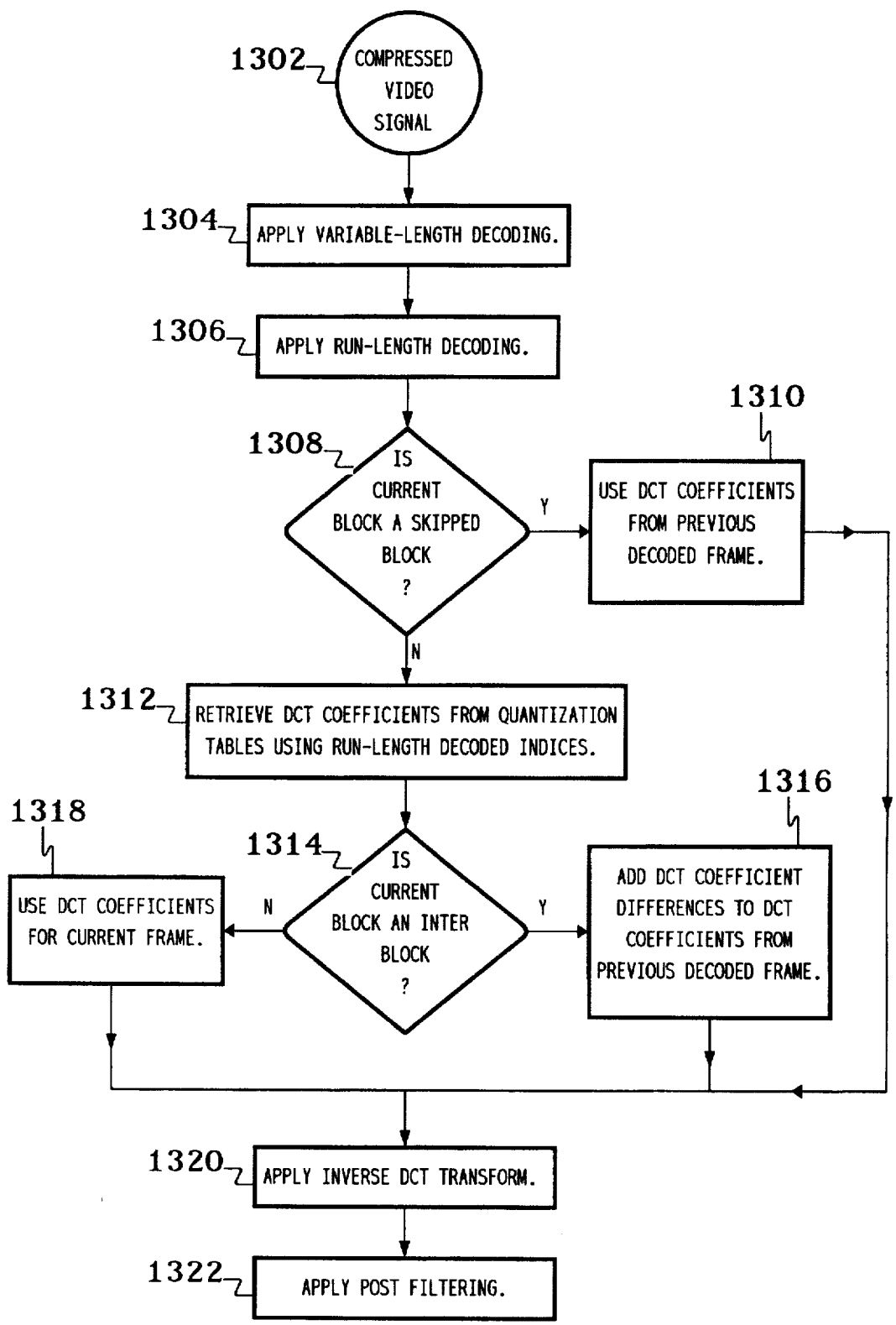
FIG. 13 is a process flow diagram of the video decompression processing implemented by PC system of FIG. 1.
Figure 14:
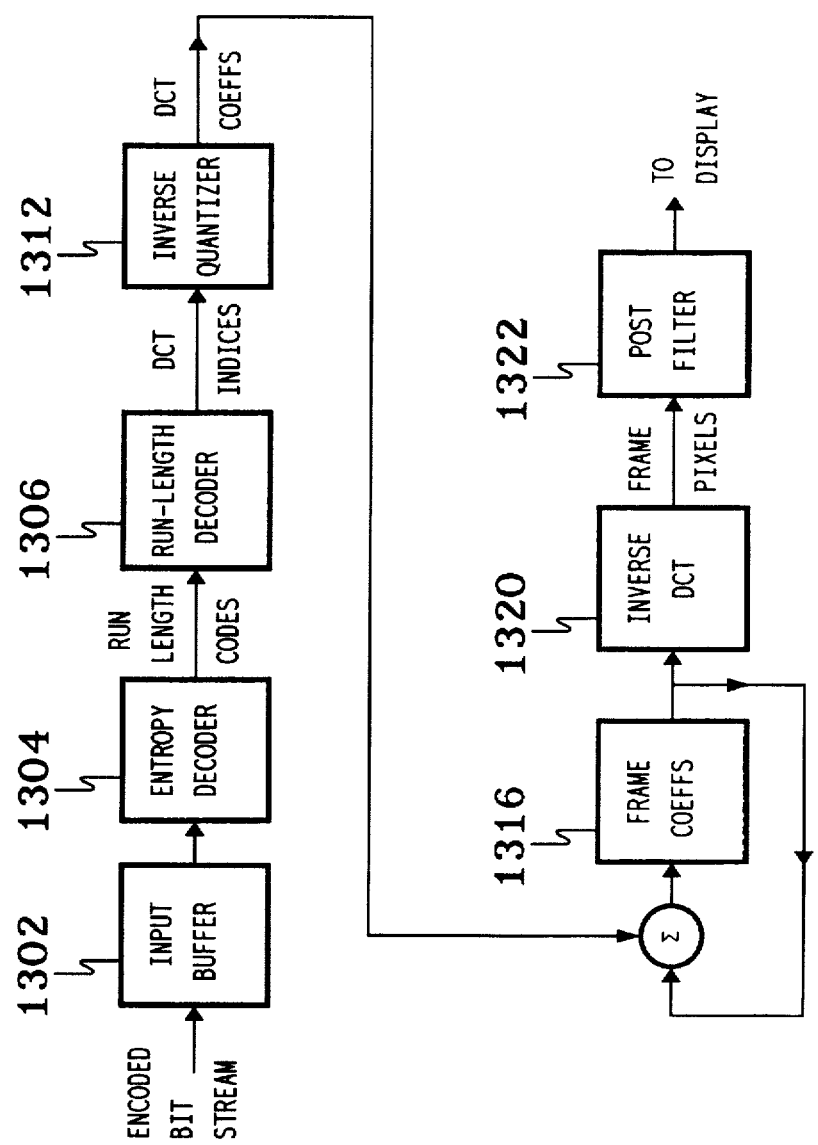
FIG. 14 is a block diagram of the decoder that implements the video decompression processing of FIG. 13.

Referring now to FIGS. 13 and 14, there are shown a process flow diagram of the video decompression processing and a block diagram of the decoder implemented on PC system 100 of FIG. 1, according to a preferred embodiment of the present invention. The video decompression processing of the decoder is preferably implemented on host processor 202 of FIG. 2. Host processor 202 is preferably capable of real-time decompression for local display of both the compressed video signals received from a remote PC system 100 over PSTN network 110 and the compressed video signals generated locally by video board 204. In general, host processor 202 reverses the operations implemented by pixel processor 302 when encoding the video signals.

Host processor 202 receives and stores compressed video signals to input buffer 1302 of FIG. 14 (step 1302 of FIG. 13). Entropy decoder 1304 of FIG. 14 then applies variable-length decoding (VLD) to the compressed video signals (step 1304 of FIG. 13). In VLD, entropy decoder 1304 parses the compressed video signals using table lookups. In a preferred embodiment, entropy decoder 1304 has access to memory sufficient to hold a plurality of VLD tables that map from VLC codes to run values and coefficient values. Since VLC codes have variable lengths, the size of each VLD table is preferably determined by the length of longest VLC code for the VLD table.

To maximize the speed of decoding variable-length codes, decode tables are preferably stored in memory. Two options are available: a full decode table which maximizes the decode speed, and a compressed decode table which requires less memory. If the maximum code length expected is N bits, then a full N-bit lookup table could be stored in memory. Each table entry would give the code size used, and the value of the decoded parameter. If each table entry consisted of 16 bits, the size of the table would be 2N+1 bytes.

Figure 15:
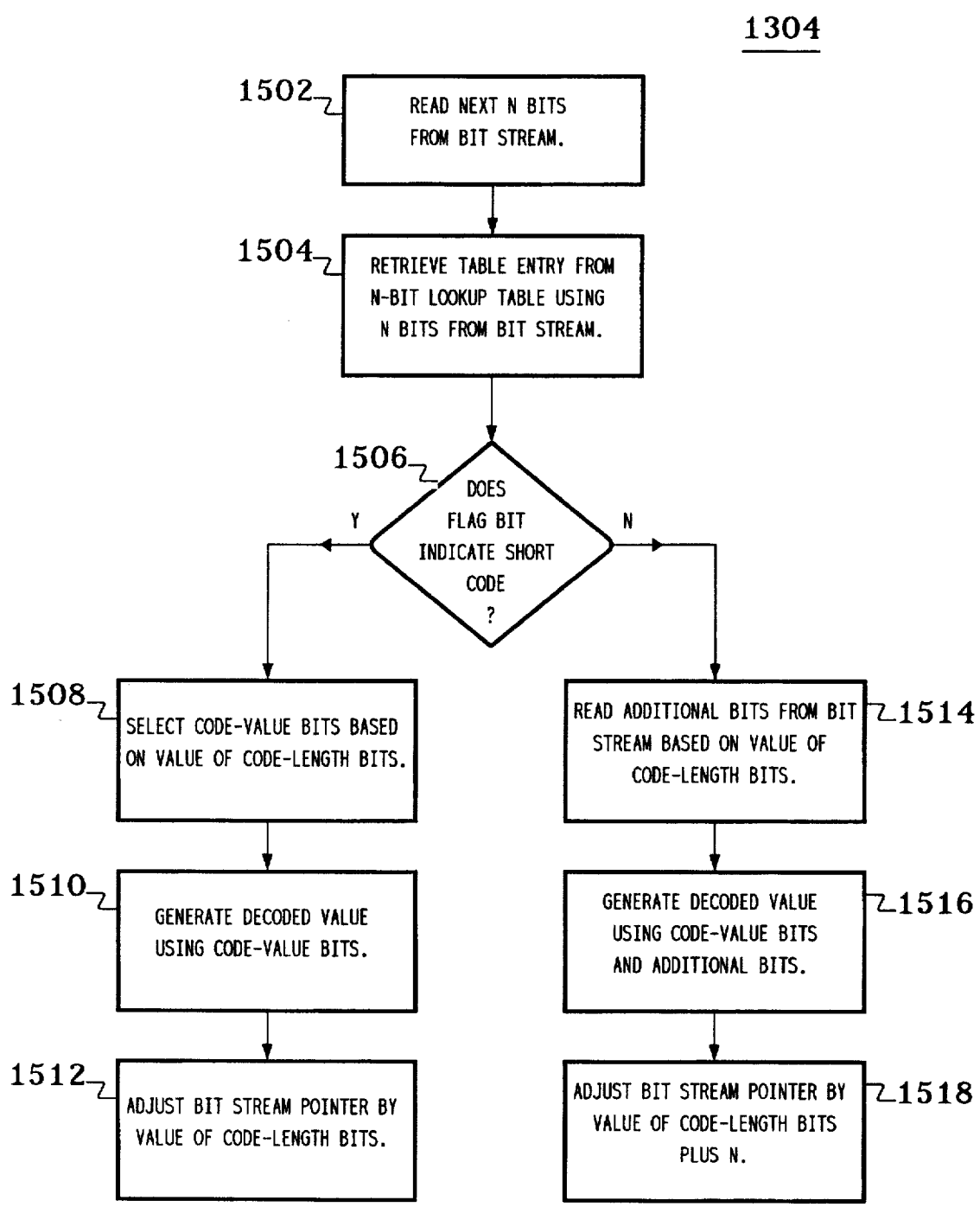
FIG. 15 is a process flow diagram of the variable-length decoding, according to a preferred embodiment of the present invention.

Referring now to FIG. 15, there is shown a process flow diagram of the variable-length decoding, according to a preferred embodiment of the present invention. Recognizing that long code words are rare, the table can be stored in a compressed format which uses considerably less memory, and which incurs only a modest speed penalty. A preferred embodiment may use a compressed table that has 256 16-bit entries. The next 8 bits of the bit stream to be decoded (step 1502 of FIG. 15) are used as an index into the table (step

1504). The 16-bit table entry gives the meaning of the bits in the bit stream, a count of the bits decoded, and an indication of how many additional bits are required to complete the VLC.

The table entry takes two forms depending on a flag bit f, bit 4. If the flag bit f is 0 (step 1506), then the table entry denotes a short code word, one of 8 bits or less:

| Bit # | (MSB) F E D C B A 9 8 7 6 5 4 3 2 1 0 (LSB) |
|---|---|
| Bits | V V V V V V V V x x S 0 L L L L |
| Meaning | \| symbol value \| \|s\|f\| length\| |

For a short code word, the most significant eight bits of the table entry give the code value, the next two are not used, the next is the sign bit s, the next is the flag bit f, and the last four denote the code length, i.e. the number of bits in the code. The sign bit s is such that a 0 denotes a negative number and a 1 denotes a positive number. That is, the value of the code-length bits determine how many bits are used to determine the code value (steps 1508 and 1510 of FIG. 15). The pointer used to read the next set of N bits from the bit stream is adjusted based on the value of the code-length bits (step 1512).

For the purposes of an illustrative example, assume that the VLC code for a value of +5 is represented by the 6-bit code 111100. The VLD table will have entries corresponding to the range of code values from 11110000 to 11110011 (decimal values 240 to 243 inclusive) equal to:

| Bit # | (MSB) F E D C B A 9 8 7 6 5 4 3 2 1 0 (LSB) |
|---|---|
| Bits | 0 0 0 0 0 1 0 1 x x 1 0 0 1 1 0 |
| Meaning | \| symbol value \| \|s\|f\| length\| |

Bits F to 8 give the value 5, bit 5 gives the sign (i.e., positive), and bits 3 to 0 give the length as 6.

If the flag bit f is 1 (step 1506 of FIG. 15), then the table entry denotes a long code word, one of more than 8 bits:

| Bit # | (MSB) F E D C B A 9 8 7 6 5 4 3 2 1 0 (LSB) |
|---|---|
| Bits | V V V V V V V V V V S 1 L L L L |
| Meaning | \| symbol offset \|s\|f\| length\| |

For a long code word, the most significant ten bits of the table entry give the symbol offset, the next bit denotes the sign bit s, the next is the flag bit f, and the last four denote the additional length of the VLC code. The magnitude of the decoded value is equal to the offset value plus the value of the additional bits. The sign bit s is such that a 0 denotes a negative number and a 1 denotes a positive number. That is, the value of the code-length bits determine how many additional bits are to read from the bit stream to complete the long variable-length code (step 1514 of FIG. 15). The value of the code-value bits are then used as an offset to be added to the value of the additional bits to generate the decoded value (step 1516). The pointer used to read the next set of N bits from the bit stream is adjusted to skip the first N bits as well as the additional bits read from the bit stream (step 1518).

For the purposes of an illustrative example, assume that the VLC code for a value of −51 is represented by the 11-bit code 00110011010. For the first 8 bits of the 11-bit code, the VLD table will have entries corresponding to the code value 00110011 equal to:

| Bit # | (MSB) F E D C B A 9 8 7 6 5 4 3 2 1 0 (LSB) |
|---|---|
| Bits | 0 0 1 1 0 0 0 0 0 1 0 1 0 0 1 1 |
| Meaning | \| symbol offset \|s\|f\| length\| |

Bits F to 8 give the offset value of 49. Bits 3 to 0 give the number of additional bits (three) to be read from the bit stream to complete the 11-bit code. These bits in the bit stream (0 1 0) have the value 2 which when added to the offset gives the magnitude of the decoded value as 51. Bit 5 gives the sign, which in this case is negative.

The structure of the table, and the decoding process, can also be defined by C code. In the following C code, T is the 16-bit table value found by using the next 8 bits of the bit stream. The function DiscardBits(N) discards the next N bit of the bit stream since they have been decoded. The variable V is the value indicated by the N bits. The function Get-Bits(N) reads the next N bits of the bit stream.

```
if ((T& 16)==0) {                //short table
    DiscardBits(T&15);           //code length
    V = T>>8;                    //decoded magnitude
    if ((T&32)==0) V = −V;       //decoded value
}
else { //long table
    DiscardBits(8);              //header length
    V = (T>>6) + GetBits(T&15);  //decoded magnitude
    if ((T&32)==0) V = −V;       //decoded value
}
```

The VLD tables are constructed and stored in memory at run time. Several tables may be stored, and the tables accessed depending on the context. For example, if a run length has just been decoded, the next table used will be that for value.

After variable-length decoding, run-length decoder 1306 of FIG. 14 applies run-length decoding to the signals (step 1306 of FIG. 13). For those embodiments in which block types are interspersed with encoded DCT coefficients, a skipped block is encoded in the bit stream with a special code (i.e., preferably 000). If a block is a skipped block (step 1308), then the DCT coefficients from the corresponding block of the previous decoded frame are used for the block of the current frame (step 1310). Otherwise, inverse quantizer 1312 of FIG. 14 uses the quantized DCT coefficients from the run-length decoded signals and the quantization table (specified in the bit stream) to retrieve the DCT coefficients (step 1312 of FIG. 13). Inverse quantizer 1312 applies un-zig-zag scanning corresponding to the zig-zag pixel scanning of FIG. 7 to reconstruct two-dimensional DCT planes in the transform domain consisting of (8×8) blocks of DCT coefficients (or DCT coefficient differences).

If a block is an inter block (step 1314 of FIG. 13), then the decoded DCT values correspond to DCT coefficient differences, which are added to the DCT coefficients of the corresponding block of the previous frame to generate the DCT coefficients for the block of the current frame (step 1316). Otherwise, the block is an intra block and the decoded DCT values correspond to DCT coefficients, which are used for the block of the current frame (step 1318). In either case, inverse DCT transformer 1320 of FIG. 14 applies an inverse DCT (IDCT) transform to transform the DCT coefficients back to the image domain to generate a decoded pixel representation (step 1320 of FIG. 13). For skipped blocks, the corresponding pixels from the previous decoded frame are preferably used to avoid duplicating an identical IDCT transformation.

Post filter 1322 of FIG. 14 then preferably applies post-filtering (step 1322 of FIG. 13) to smooth some of the artifacts (e.g., block boundaries) that may result from encoding video signals as (8×8) blocks. Postfiltering is preferably outside the decoder loop so that any effect postfiltering has is not carried forward. As a result, the process of postfiltering may be adjusted, or even omitted, without affecting the long-term decoding operation. Postfiltering is described in further detail later in this specification in the section entitled "Postfiltering."

In a preferred embodiment, host processor 202 maintains a single DCT coefficient frame buffer. For a skipped block, the corresponding block of the frame buffer is left unchanged from its state for the previous frame. For an inter block, the decoded DCT coefficient differences are added to the corresponding DCT coefficients from the previous frame. For an intra block, the decoded DCT coefficients for the current frame replace the corresponding DCT coefficients from the previous frame.

Those skilled in the art will understand that one advantage of storing the previous frame as DCT coefficients, rather than as pixel values, is that an inaccurate IDCT operation may be used without any error accumulation. Thus, the compressed video signals may be decoded by relatively inexpensive and simpler decoders. A decoder may also choose to use a faster and less accurate process of decoding if fewer processor cycles are available. This may be useful in systems where the decoding processor is multiplexed between several tasks.

Error recovery and resynchronization may be, accomplished using the lower coding levels (i.e., the transport). A process for regaining synchronization is available in the video code itself. Video sequences and video frames both start with unique sequence start codes SSC and frame start codes FSC, respectively. These start codes are preferably byte aligned and start with twenty 1's. This sequence of 1's preferably cannot be emulated by any other code combination. If loss of synchronization occurs (e.g., due to errors in the transmission channel), the decoder preferably searches the bit stream for a unique bit sequence that corresponds to either a sequence start code SSC or a frame start code FSC. The decoder then resumes decoding processing of the bit stream from the located start code.

An alternative (or additional) mechanism for error recovery and resynchronization is to use rolling intra encoded blocks, where different blocks are selected for intra encoding in different frames such that, after a specific number of successive frames, all block positions have been intra encoded.

Postfiltering

Encoding images on a block-by-block basis in which quantization is applied may lead to artifacts in the decoded images in the form of edges between the blocks. Postfiltering may be employed to smooth out those edges. Conventional methods of postfiltering use linear filters applied indiscriminately over the image or just along block boundaries. Even when applied only along block boundaries, such linear filters may blur real edges that happen to coincide with the boundaries. The postfiltering according to a preferred embodiment of the present invention (i.e., step 1322 of FIG. 13) is designed to preserve edges that coincide with block boundaries, while improving the overall quality of the decoded video.

One preferred postfilter is a non-linear spatial filter that examines the discontinuities along block boundaries. Using information about the quantization level on either side of the boundary, the filter determines if a discontinuity arose because of quantization effects or whether the discontinuity represents a true edge in the original image. According to the preferred postfilter, a test is applied to determine whether the discontinuity is to be treated as the result of quantization or as representing a true edge in the image. The test involves determining the effect quantization may have had on the resulting decoded image. If the discontinuity could have arisen because of quantization effects, then the discontinuity is reduced or removed by one of several methods.

Figure 16:
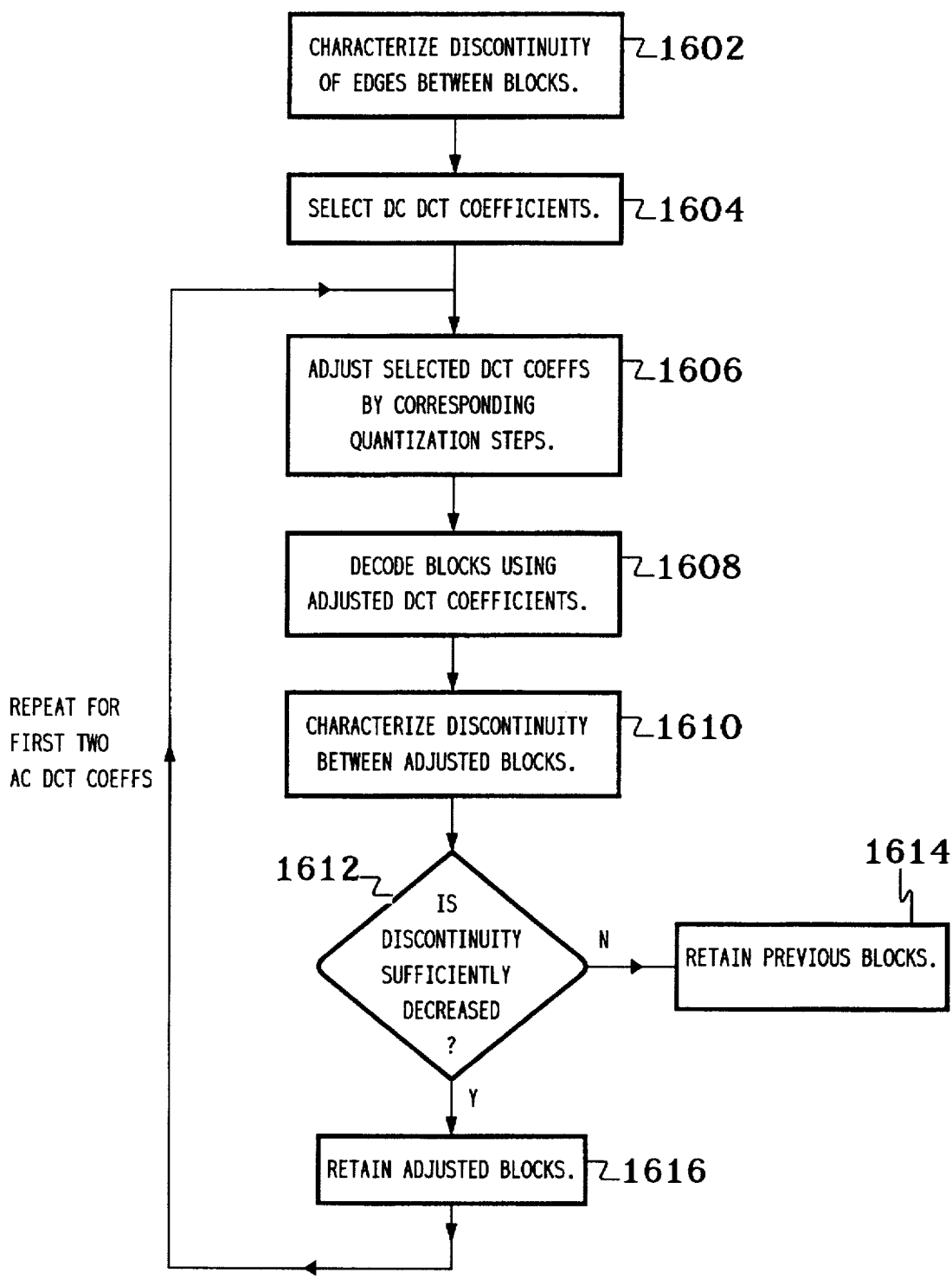
FIG. 16 is a process flow diagram of the post filtering, according to a preferred embodiment of the present invention.

One method shown in FIG. 16 adjusts the DCT coefficient values within the constraints imposed by quantization so as to minimize the energy in the edge discontinuities. For example, the DC DCT coefficient and the first two AC DCT coefficients (i.e., the three lowest frequency DCT coefficients) may be adjusted to minimize the discontinuities along the edges, while insuring that they are adjusted only to the degree attributable to quantization effects.

The first step is to attempt to adjust the DC DCT coefficient. The average discontinuity across the four edges of the block (i.e., top, bottom, left, and right) is generated (step 1602 of FIG. 16). It is then determined whether the average discontinuity could be attributable to quantization error. The quantization effect may be determined by changing the DC DCT coefficient (step 1604) of each block by the corresponding quantization step for that DCT coefficient as dictated by the quantization level selected for that block (steps 1606 and 1608). If changing the DC DCT coefficients by their quantization steps effectively eliminates the discontinuity (step 1610 and 1612), then the discontinuity is determined to be the result of quantization and the adjustments made to the DC DCT coefficients are retained (step 1616). If, on the other hand, a significant discontinuity remains after changing the DC DCT coefficients, then the discontinuity is determined to represent a true edge and the original DC DCT coefficients are retained (step 1614).

The procedure is then repeated for each of the first two AC DCT coefficients.

If the discontinuity is determined to be the result of quantization, then the postfilter reduces the amplitude of the edge. One way to accomplish this is to adjust the DCT coefficients, within the constraints imposed by the quantization, to minimize the energy of the edge. Another way is to apply a low-pass filter to the decoded pixel values across the edge or those in the neighborhood of the edge, where the filter is designed so that its effect decreases away from the edge. A third way is to apply a spline interpolation function to the decoded pixel values.

The energy of an edge may be characterized by the sum of the squares of the pixel differences between the eight pairs of decoded pixel values across a block boundary. The edge energy E may be represented by the following equation:

$$E = \sum_{n=1}^{8} d_n^2, \tag{2}$$

where $d_n$ is the difference between two adjacent pixels on either side of the block boundary.

The energy of an edge may not be independently minimized by changing the DCT coefficients since such changes will affect the far edge of the block. One way to minimize edge energy is to use only the lowest frequency DCT coefficients (e.g., the DCT DC coefficient and the first three DCT AC coefficients). Another way is to minimize the energy for each block and then iterate over the entire image.

The method of adjusting the DCT coefficients is illustrated by the following example. Consider an (8×8) block of pixels that has been decoded. For the purpose of illustration, the decoded DCT coefficients are assumed to be as follows:

| 256 | 64 | 0  | 0 | 0 | 0 | 0 | 0 |
|-----|----|----|----|---|---|---|---|
| 32  | 0  | 32 | 0 | 0 | 0 | 0 | 0 |
| 0   | 0  | 0  | 0 | 0 | 0 | 0 | 0 |
| 0   | 0  | 0  | 0 | 0 | 0 | 0 | 0 |
| 0   | 0  | 0  | 0 | 0 | 0 | 0 | 0 |
| 0   | 0  | 0  | 0 | 0 | 0 | 0 | 0 |
| 0   | 0  | 0  | 0 | 0 | 0 | 0 | 0 |
| 0   | 0  | 0  | 0 | 0 | 0 | 0 | 0 |

The corresponding decoded pixel values are:

| 56 | 50 | 41 | 33 | 28 | 28 | 31 | 34 |
|----|----|----|----|----|----|----|----|
| 54 | 49 | 40 | 33 | 28 | 28 | 30 | 32 |
| 50 | 46 | 40 | 33 | 29 | 27 | 27 | 28 |
| 46 | 43 | 39 | 34 | 29 | 26 | 24 | 23 |
| 41 | 40 | 38 | 35 | 30 | 25 | 21 | 18 |
| 36 | 37 | 37 | 35 | 31 | 24 | 18 | 14 |
| 32 | 34 | 36 | 36 | 31 | 24 | 15 | 10 |
| 30 | 33 | 36 | 36 | 31 | 23 | 14 | 8  |

In order to adjust the DCT coefficients to reduce edge discontinuities, it is necessary to examine neighboring pixels. Assume that the neighboring pixel values are as shown below in italics:

| 28 | 26 | 26 | 26 | 26 | 26 | 26 | 26 | 26 | 22 |
|----|----|----|----|----|----|----|----|----|----|
| 30 | 56 | 50 | 41 | 33 | 28 | 28 | 31 | 34 | 18 |
| 30 | 54 | 49 | 40 | 33 | 28 | 28 | 30 | 32 | 18 |
| 30 | 50 | 46 | 40 | 33 | 29 | 27 | 27 | 28 | 18 |
| 30 | 46 | 43 | 39 | 34 | 29 | 26 | 24 | 23 | 18 |
| 30 | 41 | 40 | 38 | 35 | 30 | 25 | 21 | 18 | 18 |
| 30 | 36 | 37 | 37 | 35 | 31 | 24 | 18 | 14 | 18 |
| 30 | 32 | 34 | 36 | 36 | 31 | 24 | 15 | 10 | 18 |
| 30 | 30 | 33 | 36 | 36 | 31 | 23 | 14 | 8  | 18 |
| 24 | 22 | 22 | 22 | 22 | 22 | 22 | 22 | 22 | 16 |

In this display, there are systematic discontinuities at the edges that will be visible. These can be reduced by adjusting the DCT coefficients. First note that each (8×8) block is adjusted independently (i.e., it is compared with its unadjusted neighbors). Thus, only half the error needs to be compensated by each block.

First consider adjusting the DC DCT coefficient (i.e., the (0,0) coefficient). The average of the 28 border pixels in the decoded block is 32. (This follows from the DC DCT value of 256.) Taking the average value of the neighbor for the corner pixels to be the average of the adjacent orthogonal pixels, the average DC value of the neighboring blocks is 24. Half of this difference is correctable by the current block (i.e., a DC change of (32−24)/2=4). If all of the residual difference of 4 is to be attributed to quantization error then the DC DCT coefficient would be changed from 256 to 224.

Assume that the DC quantizer level from the quantization table is 32. Then only a difference of 16 can be allowed, and the remainder can be assumed to represent real information and not quantization error. For this quantizer value, the DC coefficient would be changed from 256 to 240.

If the block is an edge or corner block, then the adjustment is carried out to match only the neighboring blocks in the frame.

Next consider the first horizontal DCT coefficient (the (1,0) AC DCT coefficient) which has a decoded value of 64. The average DC value of the left column of decoded pixels is 43.125 versus 30 of the neighboring pixels. The average DC value of the right column of decoded pixels is 20.875 versus 18 of the neighboring pixels. The average net AC difference is (43.125−30+18−20.875)/2=5.125. Half of this difference should be compensated by changing the AC coefficient in the current block. This could be accomplished by changing the AC coefficient from 64 to 49. If the quantizer level in the quantization table were 32, then all of this change could be attributed to quantization effects, and the AC coefficient in the displayed image could be set to 49. If the quantizer level were 16, then only 8 could be attributed to quantization effects, and the DCT coefficient in the displayed image should be set to 64−8=56.

In this example, only the left and right edges were considered. The errors at the top and bottom are also affected by the (1,0) AC DCT coefficient. It will be obvious to those skilled in the art how to extend the foregoing procedure in order to take these errors into account.

It will also be obvious how to adjust the (0,1) and the (1,1) AC DCT coefficients. It may not be worthwhile adjusting higher frequency AC coefficients, and the method described here works for these four coefficients. If higher level coefficients are to be adjusted, then more careful attention is to be paid to all four edges for each coefficient.

Note that this method adjusts the lowest frequencies in an image in order to reduce those block discontinuities that can be attributed to quantization effects.

It may be desirable to carry a slightly larger adjustment than is allowed for in the foregoing procedure, to allow for quantization effects affecting higher frequency DCT coefficients. This is illustrated by the following example. Consider a vertical edge that occurs in the middle of a block. Assume that pixels to the left of the edge have a value of 18 and those to the right have a value of 0. The eight horizontal DCT coefficients corresponding to this block are

| 72 | 65 | 0 | −23 | 0 | 15 | 0 | −13 |
|----|----|---|-----|---|----|---|-----|

Assume that the quantization table is such that the higher frequencies are eliminated, but that the low frequencies are preserved with complete accuracy. The decoded DCT values will then be:

| 72 | 65 | 0 | 0 | 0 | 0 | 0 | 0 |
|----|----|---|---|---|---|---|---|

The decoded pixels will then be:

| 20 | 19 | 15 | 11 | 7 | 3 | −1 | −2 |
|----|----|----|----|---|---|----|----|

This gives a discontinuity of 2 levels at the right and left boundaries of the block. Note that this discontinuity is due to the elimination of high frequency DCT coefficients, and not to quantization effects in the transmitted DCT coefficients. This effect means that it is beneficial to adjust the transmitted DCT coefficients to a slightly greater extent than would be indicated by the quantization level.

Compressed Video Signal Bit Stream Syntax

Referring now to FIG. 17, there is shown a representation of the bit stream syntax of the compressed video signal generated by pixel processor 302 and transmitted by PSTN interface 206 over PSTN connection 110, according to a preferred embodiment of the present invention. A typical compressed video signal may comprise a leading Sequence Header SH, interleaved Frame Headers FH and variable-length Frame Bodies FB, and a trailing Sequence End Code SEC.

A compressed video signal corresponding to a sequence of video frames starts with a Sequence Header SH, which defines parameters that remain fixed for the entire sequence. Each video frame in the sequence starts with a Frame Header FH, which defines parameters for that frame. The Frame Body FB consists of bits that define the block type (i.e., intra, inter, or skipped) and the quantized DCT coefficients (or quantized DCT coefficient differences) for each (8×8) block in the current frame. The sequence terminates with a Sequence End Code SEC. The Sequence End Code SEC is a 24-bit byte-aligned number equal to FFFFF7 hex. The SEC may be preceded by any number of 1's. A sequence may be interrupted with a new Sequence Header if any of the sequence parameters are to be changed.

Sequence Header

Referring now to FIG. 18, there is shown a representation of the 12-byte Sequence Header SH of the compressed video bit stream syntax of FIG. 17, according to a preferred embodiment of the present invention.

The Sequence Header SH begins (i.e., bytes 0–2 of FIG. 18) with a 24-bit byte-aligned sequence start code SSC, which is preferably equal to FFFFF4 hex. The Sequence Header SH may be preceded by any number of 1's. The unique sequence start code allows a decoder to identify the type of bit stream. In addition, the sequence start code may be detected in a bit stream by a decoder even after the loss of bit synchronization caused by, for example, a bit error or by the interception of a bit stream after it has begun. In this way, the sequence start code may be used as a means for the decoder to resynchronize the decoding processing.

Byte 3 of the Sequence Header SH is an 8-bit binary version number, which preferably has a value of 02 hex.

Bytes 4 and 5 of the Sequence Header SH are 8-bit values that represent the horizontal and vertical resolutions, respectively, of the Y-component planes in the video sequence in 8-pixel units. The values in bytes 4 and 5 are one-eighth the actual resolutions. That is, a value of 01 hex corresponds to a resolutions of 8 pixels.

The first 4 bits of byte 6 of the Sequence Header SH represent the horizontal subsampling ratio for the U and V component planes relative to the Y component planes. Similarly, the last 4 bits of byte 6 of the Sequence Header SH represent the vertical subsampling ratio for the U and V component planes relative to the Y component planes. In a preferred embodiment in which the video signals are captured in 4:1:1 YUV format, the horizontal and vertical two subsampling ratios are both 4.

Byte 7 of the Sequence Header SH is the 8-bit aspect ratio for the video sequence. In a preferred embodiment, the aspect ratio has a value of 1 and corresponds to square pixels.

Byte 8 of the Sequence Header SH is the 8-bit basic frame rate. In a preferred embodiment, the first two bits of Byte 8 indicate the frame rate of the source signal. For example, (00) may represent 30 frames per second (FPS), (01) may represent 29.96 FPS, (10) may represent 25 FPS, and (11) may be reserved. The next 6 bits of Byte 8 may be used to indicated the basic frame rate rounded to the nearest integer, where the binary value is the basic frame rate.

Byte 9 of the Sequence Header SH is an 8-bit number that defines the channel bit rate in units of 400 bits per second (bps). If byte 9 has a value of zero, then the bit rate is variable. A value of 255 is preferably reserved.

Byte 10 of the Sequence Header SH is an 8-bit number that defines the minimum size of the decoder buffer needed to decode the sequence. The size is given in units of 256 bytes.

Byte 11 of the Sequence Header SH is an 8-bit number that defines the complexity of the bit stream and consequently the requirements of the decoder.

Frame Header

Referring now to FIG. 19, there is shown a representation of the 6-byte Frame Header FH of the compressed video bit stream syntax of FIG. 17, according to a preferred embodiment of the present invention.

The Frame Header FH begins (i.e., bytes 0, 1 and part of 2 of FIG. 19) with a 22-bit byte-aligned frame start code FSC. The first 20 bits of FSC are all 1's and the next two bits are both 0's. The Frame Header FH may be preceded by any number of 1's. The last two bits of byte 2 of the Frame Header FH are spare bits that are reserved for future use. As with the sequence start code, the unique frame start code allows a decoder to identify the type of bit stream. In addition, the frame start code may be detected in a bit stream by a decoder even after the loss of bit synchronization cause by, for example, a bit error or by the interception of a bit stream after it has begun. In this way, the frame start code may be used as a means for the decoder to resynchronize the decoding processing.

The first four bits of byte 3 of the Frame Header FH specifies the frame number. The frame number (i.e., 0–15) may be used by the decoder to control the timing of the display of frames when frames are dropped by the encoder exercising the secondary bit rate control.

The last four bits of byte 3 of the Frame Header FH are the buffer status. The buffer status indicates the fullness of the buffer at the start of the current frame in terms of the size of the buffer given in the Sequence Header SH according to the following relationship:

status=16*fullness/size.

The buffer status may be used to synchronize the encoder and decoder clocks.

If the decoder clock is running at a different rate from the encoder clock (e.g., where the information is being relayed from a data storage unit), then the decoder buffer will gradually fill up or gradually empty depending on whether the decoder clock is running slow or fast relative to the encoder clock. The buffer status allows the decoder to determine whether this situation has occurred.

If the buffer status from the bit stream indicates that the buffer is sufficiently fuller than the actual status of the decoder buffer, then the decoding process is running too slowly and more bits are accumulating in the decoder buffer than are being used to display the frame. A corrective strategy is for the decoder to reduce temporarily the intervals between the display of the frame.

Conversely, if the buffer status from the bit stream indicates that the buffer is lower than the actual status of the decoder buffer, then the decoder clock is running too quickly and the decoder can correct the situation by temporarily delaying the display of the frame.

These strategies will restore the decoder buffer to that indicated by the status and insure that the decoder is displaying frames at the correct rate.

The first three bits of byte 4 of the Frame Header FH are the frame type code FTC. In a preferred embodiment:

FTC=0=>Mixed frame (encoded using all three types of blocks: inter, intra, and skipped);

FTC=1=>Predicted frame (encoded using only inter and skipped blocks); and

FTC=2=>Reference frame (encoded using only intra blocks).

The frame type code FTC indicates which VLC code tables to use to decode the compressed signals.

In a preferred embodiment of the present invention, the DCT DC coefficient of intra blocks in mixed frames is predicted from the previous frame. It will be understood by those skilled in the art, that, since arithmetic DCT errors do not produce a long term accumulation, contrary to the MPEG and H.261 standards, the compressed video stream of the present invention does not require a periodic refresh. The purpose of intra blocks in mixed frames in the present invention is for coding efficiency, not for refresh.

The last five bits of byte 4 of the Frame Header FH indicates the quantizer base index QBI. The QBI, together with data from previously-transmitted frames, determines the DCT quantization table for each block. If the frame is the first in a sequence, then the QBI alone determines the DCT quantization table and the quantization is uniform over the frame. In an embodiment which implements locally adaptive quantization level selection, the QBI is the base quantizer level for the frame and a quantizer offset index indicates the offset from the QBI for a particular block.

Byte 5 of the Frame Header FH comprises eight flags TS7 to TS0, which are used for quantization table selection. TS7 is the MSB and TS0 is the LSB in byte 5. For each inter block of mixed frames, bits TS6 and TS7 define the VLC code table to use for the first run, as defined later in the specification in conjunction with Table XII.

In a preferred embodiment, there is no unique end-of-frame code. The end of a frame occurs when all of the blocks have been defined. In an alternative preferred embodiment, there is a unique end-of-frame code. There may be additional 1's present to fill out the last byte. These 1's are called stuffing bits. The end of a frame may also be indicated by the presence of a new frame start code FSC, a sequence start code SSC, and end-of-frame EOF code, or a Sequence End Code SEC. If any of these occur before all of the blocks are specified, then the decoder knows how to interpret the remainder of the blocks in the frame. For example, in a mixed frame or a predicted frame, the remainder of the blocks are skipped blocks. In a reference frame, the remainder of the blocks are assumed to be of a uniform color based on the DC value of the previously coded block.

Frame Body

The Frame Body FB for each frame of a video sequence is encoded differently depending upon whether the frame is a reference frame, a mixed frame, or a predicted frame.

Frame Body for Reference Frames

Reference frames contain only intra blocks. All of the Y component blocks are preferably encoded first, followed by all of the U blocks and then by all of the V blocks.

For each intra block of a reference frame, the DCT DC coefficient is encoded first and is differentially coded with respect to the predicted value (i.e., based on the DCT DC coefficient for the corresponding block of the previous frame). In reference frames, the DCT DC coefficient of the first block of each plane (Y, U, and V) is preferably predicted to be 2048 corresponding to a mid gray level. The DCT DC coefficients of the remaining blocks in each plane are predicted to be that of the previous block.

Table I contains the preferred VLC codes for DCT DC coefficients in intra blocks of reference frames. In each entry, X may be either a 0 or a 1 and S is the sign bit, where 0 implies a negative value and 1 implies a positive value. NQI is the new quantizer index code. NQI is followed by a five-bit number defining a new quantizer base index QBI. EOF is the end-of-frame code which indicates that there are no more coded blocks in the current frame. After an EOF code, any remaining blocks in the component plane of the current frame are decoded using a uniform color equal to the DCT DC coefficient of the last coded block (i.e., the coded block before the EOF code).

TABLE I

VLC Codes for DCT DC Coefficient Values for Intra Blocks of Reference Frames.

| VALUE | BITS | CODE |
|---|---|---|
| 0 | 3 | 000 |
| 1 | 4 | 001S |
| 2–5 | 5 | 01XXS |
| 6–13 | 6 | 10XXXS |
| 14–21 | 7 | 110XXXS |
| 22–37 | 9 | 1110XXXXS |
| 38–69 | 11 | 11110XXXXXS |
| 70–101 | 12 | 111110XXXXXS |
| 102–117 | 12 | 1111110XXXXS |
| 118–125 | 12 | 11111110XXXS |
| 126–127 | 12 | 111111100XS |
| NQI | 11 | 11111111100 |
| EOF | 11 | 11111111101 |

In Table I, each value corresponds to the difference between two quantized DCT DC coefficients for two consecutive blocks of the reference frame, following a raster scan sequence. In a preferred embodiment, both the encoder and decoder assume that the quantized DCT DC coefficient for the first block in each plane is encoded as a difference from the value 1024, which corresponds to a gray-level pixel value of 128.

After the DCT DC coefficient value, run values and DCT AC coefficient values are coded following the zig-zag pixel scan pattern of FIG. 7. Table II contains the preferred VLC codes for the run values in intra blocks of reference frames. EOB is the end-of-block code, which indicates that there are no more non-zero quantized DCT coefficients in the block.

TABLE II

VLC Codes for Zero DCT Coefficient Run Values for Intra Blocks of Reference Frames.

| VALUE | BITS | CODE |
|---|---|---|
| EOB | 1 | 0 |
| 0 | 2 | 10 |
| 1–2 | 4 | 110X |
| 3–4 | 5 | 1110X |
| 5–6 | 6 | 11110X |
| 7–10 | 8 | 111110XX |
| 11–18 | 10 | 1111110XXX |
| 19–34 | 12 | 11111110XXXX |
| 35–63 | 13 | 111111111XXXXX |

Table III contains the preferred VLC codes for the non-zero DCT AC coefficients in intra blocks of reference frames. A DCT AC coefficient value of 98 (which would consist of fourteen 1's) is not permitted in order to avoid confusion with either the sequence start code or the frame start code.

TABLE III

VLC Codes for Non-Zero DCT AC Coefficient Values for Intra Blocks of Reference Frames.

| VALUE | BITS | CODE |
|---|---|---|
| 1 | 2 | 0S |
| 2 | 3 | 10S |
| 3–4 | 5 | 110XS |
| 5–6 | 6 | 1110XS |
| 7–10 | 8 | 11110XXS |
| 11–18 | 10 | 111110XXXS |
| 19–34 | 12 | 1111110XXXXS |
| 35–97 | 14 | 1111111XXXXXXS |

Referring now to FIG. 20, there is shown, for illustrative purposes, an example of an intra block. Using the zig-zag pixel scanning sequence of FIG. 7, the run-length encoded version of the intra block of FIG. 20 is:

−4, run 0, +5, run 8, +6, end of block

The VLC code version of this run-length sequence is given in Table IV.

TABLE IV

Variable-Length Coding for Example of Intra Block.

| QUANTITY | CODE | |
| --- | --- | --- |
| DC value of −4 | 01100 | From Table I |
| Run of 0 | 10 | From Table II |
| AC value of +5 | 111001 | From Table III |
| Run of 8 | 11111001 | From Table II |
| AC value of −6 | 111010 | From Table III |
| End of block | 0 | From Table II |

Frame Body for Mixed Frames

Mixed frames contain all three types of blocks: inter blocks, intra blocks, and skipped blocks. The block types for the blocks of all three (Y, U, V) component planes are preferably encoded first, followed by DCT coefficients for those blocks that are not skipped blocks. The block types for the Y component plane are preferably encoded first, followed by the block types for the U component plane and then by the block types for the V component plane.

Coding Block Types for Mixed Frames

Blocks in a component plane of a mixed frame are run-length encoded by scanning following a specified block scanning pattern. A goal is selecting a particular scan pattern is to maximize the number of skipped blocks at the end of the scan pattern, thereby reducing the number of runs used to represent the blocks of the component plane and reducing the number of bits used to represent the frame.

Figure 21:
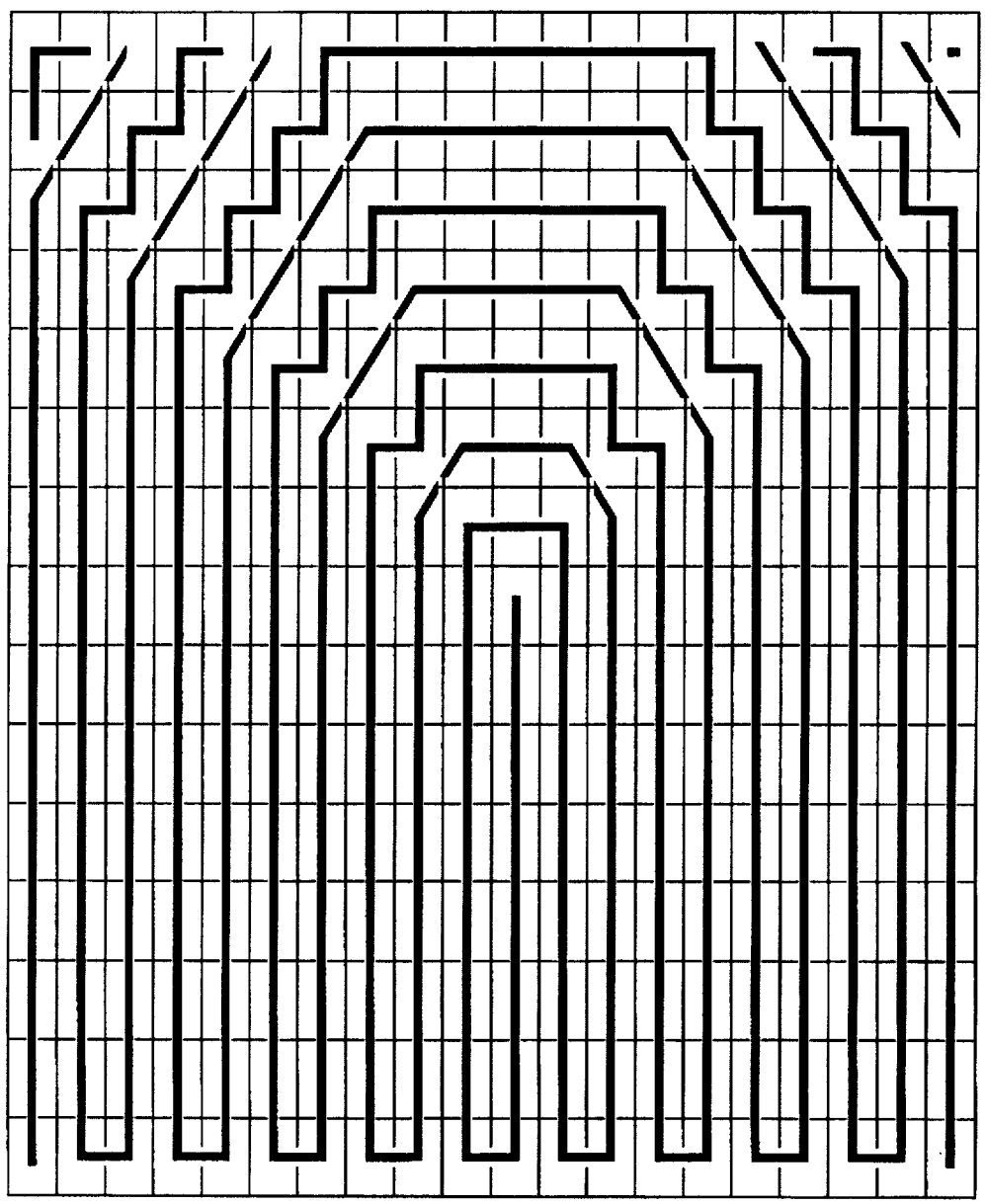
FIG. 21 shows the preferred block scanning pattern for the Y component plane of a (160×120) frame.
Figure 22:
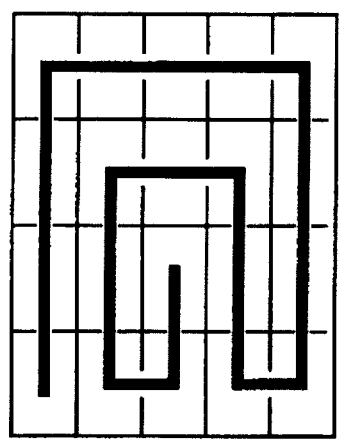
FIG. 22 shows the preferred block scanning pattern for the subsampled U and V component planes of a (160×120) frame.

Referring now to FIGS. 21 and 22, there are shown preferred block scanning patterns for the Y component plane and for the U and V component planes of a (160×120) frame. According to these scan patterns, run-length encoding starts near the center of the plane and follows the path as shown. Those skilled in the art will understand that preferred scan patterns are designed to maximize the length of runs of skipped blocks at the end of the scan pattern under the video conferencing paradigm of a "talking head" (i.e., a video image of a person centered on a stationary background scene).

According to the present invention, the desired scan patterns may be specified in different ways. For example, particular scan patterns for particular frame sizes may be hard-coded into the encoder and decoder as look-up tables. The encoder and decoder would know which scan pattern to use from the current frame size.

Alternatively, the encoder and decoder may have a variety of pre-defined scan patterns for each frame size. The encoder may select a particular scan pattern based on an analysis of the content of the current frame (or multiple recent frames) and indicate the selected scan pattern explicitly in the encoded bit stream, for example, by a scan pattern identification code. The decoder would then be able to select the appropriate scan pattern based on the scan pattern identification code in the bit stream.

In yet another preferred embodiment, the encoder and decoder are both programmed to implement a particular scan pattern generation algorithm that relies on one or more input parameters. For example, an input parameter may be a frame position corresponding to the block at the center of activity within the frame. The encoder would select the input parameters after analyzing the frame content, generate the appropriate scan patterns, and explicitly encode the selected input parameters in the bit stream. The decoder would be able to implement the same scan pattern generation algorithm using the input parameters specified in the bit stream to generate the same scan patterns used by the encoder.

A preferred scan pattern generation algorithm was used to generate the scan patterns of FIGS. 21 and 22. The algorithm is defined by the following high-level pseudo code:

find starting position x,y do
    follow path 1 up left and down using diagonals
    follow path 2 up right and down using orthogonals until
        all blocks have been added to the scan path Note that the scanning path may travel outside the rectangle defined by the blocks, but only blocks within the defined size of the frame are added to the scanning path.

A C-code implementation of the algorithm is given below. Note that the blocks are numbered in raster scan order. For example, an image 40 pixels wide and 24 pixels high would have an array of (5×3) blocks which would be numbered as shown below:

```
0 1 2 3 4
5 6 7 8 9
10 11 12 13 14
//GLOBAL VARIABLES
I16 bsi[]; //Block Scanning Index: gives order of block [n]
I16 bso[]; //Block Scanning Order: gives block of order [n]
//After execution of the algorithm:
// bso contains: 7 12 11 6 1 2 3 8 13 14 9 4 0 5 10
// bsi contains: 12 4 5 6 11 13 3 0 7 10 14 2 1 8 9
I16 hor; //Horizontal size of image measured in blocks
I16 vrt; //Vertical size of image measured in blocks
void
GenPath( ) //Generate scan path and store in bso and bsi
{
 I16 b; //Block Number
 I16 nb; //Number of Blocks
 I16 I; //local variable
 I16 s; //Scan order
 I16 x,y; //current position
 //1. initialize
 nb=hor*vrt;
 for (i=0;i<nb;i++) bsi[i]=bso[i]=−1;
 //2. define starting position x,y
 x=hor/2;
 y=vrt/2;
 s=0;
 b=y*hor+x;
 bso[s]=b;
 bsi[b]=s++;
 if (s==nb) return;
 //3. do rest of path
 while(1) {
  //3.1 go around path type 1 to bottom of pic
  while(1) {
   y++; //look down
   if (y==vrt) {y—; break;} //at bottom edge, goto path 2
   if (x<hor) {
    b=y*hor+x;
    if (bsi[b]<0) {//block b has not been added to scan path
     bso[s]=b; //add block b to the scan path
     bsi[b]=s++;
     if (s==nb) return; //all blocks added to scan path
    continue;
   }}
   x—; //look down & left
   if (x<0) break; //goto path 2
   b=y*hor+x;
   if (bsi[b]<0) {
    bso[s]=b;
    bsi[b]=s++;
    if (s==nb) return;
```

```
  continue;
}
y—; //look left
if (y<0) continue; //move left above top edge
b=y*hor+x;
if (bsi[b]<0) {
  bso[s]=b;
  bsi[b]=s++;
  if (s==nb) return;
  continue;
}
y—; //look Up & left
if (y<0) continue; //move left above top edge
b=y*hor+x;
if (bsi[b]<0) {
  bso[s]=b;
  bsi[b]=s++;
  if (s==nb) return;
  continue;
}
x++; //look Up
if (x==hor) continue; //move up to right of right edge
b=y*hor+x;
if (bsi[b]<0) {
  bso[s]=b;
  bsi[b]=s++;
  if (s==nb) return;
  continue;
}
cuses("ERROR 1");
}
//3.2 go left 1 step at bottom of pic
if (x >0) {
  x—;
  b=y*hor+x;
  bso[s]=b;
  bsi[b]=s++;
  if (s==nb) return;
}
else if (x==0) x—;
//3.3 go up 1 step at bottom of pic
y—;
if (x>=0 && y>=0) {
  b=y*hor+x;
  bso[s]=b;
  bsi[b]=s++;
  if (s==nb) return;
}
//3.4 go around path type 2 to bottom of pic
while(1) {
  y++; //look down
  if (y==vrt) {y—; break;} //goto path 1
  if (x>=0 && x<hor) {
    b=y*hor+x;
    if (bsi[b]<0) {
      bso[s]=b;
      bsi[b]=s++;
      if (s==nb) return;
      continue;
    }
  }
  x++; y—; //look right
  if (x==hor) break; //goto path 1
  if (y<0) continue; //move to right above top edge
  if (x>=0) {
    b=y*hor+x;
    if (bsi[b]<0) {
      bso[s]=b;
      bsi[b]=s++;
      if (s==nb) return;
      continue;
    }
  }
  x—; y—; //look up
  if (y<0) {x++; continue;} //move to right above top edge
  if (x>=0 && x<hor) {
    b=y*hor+x;
    if (bsi[b]<0) {
      bso[s]=b;
      bsi[b]=s++;
      if (s==nb) return;
      continue;
    }
  }
  y++; //back to where we were
  if (y<0) x++;
  else if (x<0) y—;
  else if (x=hor) y++;
  else cuses("ERROR 2");
}
//3.7 go right 1 step at bottom of pic
if (x<hor-1) {
  x++;
  b=y*hor+x;
  bso[s]=b;
  bsi[b]=s++;
  if (s==nb) return;
}
else if (x==hor-1) x++;
//3.8 go up 1 step at bottom of pic
y—;
if (x<hor) {
  b=y*hor+x;
  bso[s]=b;
  bsi[b]=s++;
  if (s==nb) return;
}
}}
```

The algorithm is executed once at the beginning of each sequence. Consequently there is no great need for the algorithm to be efficient.

The first block in each of the Y, U, and V component planes is encoded according to the VLC codes in Table V.

TABLE V

VLC Codes for the First Block in Component Planes of Mixed Frames.

| TYPE | CODE |
|---|---|
| Skipped | 0 |
| Inter | 10 |
| Intra | 11 |

The remaining block types are coded with a run-length scheme. The VLC codes for the number of successive blocks of the same type are given in Table VI. The continue code CONT indicates that a run of 82 skipped blocks has occurred and that the run continues. For example, a run of 87 would be VLC coded as CONT plus 5 (i.e., 11111111011011, where 111111110 represents CONT and 110011 represents 5). The end code END indicates that all of the remaining blocks in the component plane are the same as the last block type. If the last coded block type corresponds to the last block in the component plane, then the end code END is omitted. When the U component plane is coded, an end code END indicates that all of the remaining U blocks in the U component plane and all of the V blocks in the V component plane are the same as the last block type.

TABLE VI

VLC Codes for Run Lengths of Block Types for Mixed Frames.

| RUN | BITS | CODE |
|---|---|---|
| 1 | 1 | 0 |
| 2 | 2 | 10 |
| 3 | 4 | 1100 |
| 4–5 | 5 | 1101X |
| 6–7 | 6 | 11100X |
| 8–10 | 7 | 11101XX |
| END | 7 | 1110111 |
| 11–18 | 8 | 11110XXX |
| 19–34 | 10 | 111110XXXX |

TABLE VI-continued

VLC Codes for Run Lengths of Block Types for Mixed Frames.

| RUN | BITS | CODE |
|---|---|---|
| 35–66 | 12 | 1111110XXXXX |
| 67–82 | 12 | 11111110XXXX |
| CONT | 9 | 111111110 |

After each run, the new block type is indicated by the block type change codes of Table VII.

TABLE VII

Block Type Change Codes for Mixed Frames.

| BLOCK TYPE | | |
|---|---|---|
| OLD | NEW | CODE |
| Skipped | Inter | 1 |
| Inter | Intra | 1 |
| Intra | Skipped | 1 |
| Skipped | Intra | 0 |
| Inter | Skipped | 0 |
| Intra | Inter | 0 |

In a preferred embodiment, each frame is encoded in the following sequence: Y block types, U block types, V block types, Y data, U data, V data.

Coding Inter Blocks in Mixed Frames

Each inter block in a mixed frame is encoded as run values and coefficient difference values (relative to the corresponding reconstructed quantized DCT coefficients of the previous frame). To take advantage of the fact that the first run value in an inter block is typically small, there are preferably four different VLC tables that may be used to encode the first run value in an inter block. One of the four VLC tables is selected for the current frame based on the longest first run value for all of the inter blocks in the frame.

Table VIII contains the VLC codes for the inter-block first run values, where the longest first run value is less than or equal to 2.

TABLE VIII

VLC Codes for First Run Lengths of Inter Blocks of Mixed Frames, Where Max Run Length <= 2.

| RUN | BITS | CODE |
|---|---|---|
| 0 | 1 | 0 |
| 1 | 2 | 10 |
| 2 | 2 | 11 |

Table IX contains the VLC codes for the inter-block first run values, where the longest first run value is greater than 2, but less than or equal to 4.

TABLE IX

VLC Codes for First Run Lengths of Inter Blocks of Mixed Frames, Where Max Run Length <= 4.

| RUN | BITS | CODE |
|---|---|---|
| 0 | 1 | 0 |
| 1 | 2 | 10 |
| 2 | 3 | 110 |
| 3–4 | 4 | 111X |

Table X contains the VLC codes for the inter-block first run values, where the longest first run value is greater than 4, but less than or equal to 14.

TABLE X

VLC Codes for First Run Lengths of Inter Blocks of Mixed Frames, Where Max Run Length <= 14.

| RUN | BITS | CODE |
|---|---|---|
| 0 | 1 | 0 |
| 1 | 2 | 10 |
| 2 | 3 | 110 |
| 3–4 | 5 | 1110X |
| 5–6 | 6 | 11110X |
| 7–14 | 8 | 11111XXX |

Table XI contains the VLC codes for the inter-block first run values, where the longest first run value is greater than 14, but less than or equal to 63. RCW is preferably a reserved code word. NQI is the new quantizer index code. NQI is followed by a five-bit number defining a new quantizer base index QBI.

TABLE XI

VLC Codes for First Run Lengths of Inter Blocks of Mixed Frames, Where Max Run Length <= 63.

| RUN | BITS | CODE |
|---|---|---|
| 0 | 1 | 0 |
| 1 | 2 | 10 |
| 2 | 3 | 110 |
| 3–4 | 5 | 1110X |
| 5–6 | 6 | 11110X |
| 7–10 | 8 | 111110XX |
| 11–18 | 10 | 1111110XXX |
| 19–34 | 12 | 11111110XXXX |
| 35–50 | 13 | 111111110XXXX |
| 51–58 | 13 | 1111111110XXX |
| 59–62 | 13 | 11111111110XX |
| 63 | 13 | 1111111111100 |
| RCW | 13 | 1111111111101 |
| NQI | 13 | 1111111111110 |

The first-run table selected for the current frame is specified in the TS6 and TS7 flag bits of byte 5 of the Frame Header FH, as defined in Table XII and described earlier in the specification in conjunction with FIG. 19.

TABLE XII

Frame Header Flag Bit Values for VLC First Run Length Tables.

| TS7 | TS6 | TABLE |
|---|---|---|
| 0 | 0 | VIII |
| 0 | 1 | IX |
| 1 | 0 | X |
| 1 | 1 | XI |

Table XIII contains the VLC codes for the run values after the first run in an inter block of a mixed frame. EOB is the end-of-block code which indicates that the remaining DCT coefficients are all zero.

TABLE XIII

VLC Codes for Run Lengths of Inter Blocks of Mixed Frames Other Than the First Runs.

| RUN | BITS | CODE |
|---|---|---|
| EOB | 1 | 0 |
| 0 | 2 | 10 |

TABLE XIII-continued

VLC Codes for Run Lengths of Inter Blocks of
Mixed Frames Other Than the First Runs.

| RUN | BITS | CODE |
|---|---|---|
| 1–2 | 4 | 110X |
| 3–4 | 5 | 1110X |
| 5–6 | 6 | 11110X |
| 7–10 | 8 | 111110XX |
| 11–18 | 10 | 1111110XXX |
| 19–34 | 12 | 11111110XXXX |
| 35–62 | 13 | 111111110XXXX |

Table XIV contains the VLC codes for the DCT coefficient difference values for an inter block of a mixed frame. Note that the VLC codes of Table XIV are the same as the VLC codes for the DCT AC coefficients for an intra block of a reference frame (Table III).

TABLE XIV

VLC Codes for DCT Coefficient Difference Values
for Inter Blocks of Mixed Frames.

| VALUE | BITS | CODE |
|---|---|---|
| 1 | 2 | 0S |
| 2 | 3 | 10s |
| 3–4 | 5 | 110XS |
| 5–6 | 6 | 1110XS |
| 7–10 | 8 | 11110XXS |
| 11–18 | 10 | 111110XXXS |
| 19–34 | 12 | 1111110XXXXS |
| 35–97 | 14 | 111111110XXXXXXS |

Coding Intra and Skipped Blocks in Mixed Frames

Intra and skipped blocks in mixed frames are preferably encoded in the same way as intra and skipped blocks in reference frames, as described earlier in the specification.

Frame Body for Predicted Frames

Predicted frames are encoded using only inter blocks and skipped blocks. As with mixed frames, the block types are coded first followed by the DCT coefficients for the inter blocks. The block types for the Y component plane are preferably encoded first, followed by the block types for the U component plane and then by the block types for the V component plane. The coding method is the same as for mixed frames, except for the method of coding block types, which takes advantage of the absence of intra blocks to save some bits. The inter blocks and skipped blocks of predicted frames are preferably encoded in the same way as the inter blocks and skipped blocks of mixed frames, respectively.

Coding Block Types in Predicted Frames

Blocks in a component plane of a predicted frame are run-length encoded by scanning in a specified scan pattern. In a preferred embodiment, the scan pattern is the same as that used for scanning blocks in mixed frames. Table XV contains the block codes for the first block in a predicted frame. The remaining block types are VLC coded with the run-length scheme of Table VI. After each run, the new block type changes from skipped to inter or from inter to skipped. Since there are only two possible types of blocks for predicted frames, there is no need for an explicit change code.

TABLE XV

VLC Codes for the First Block in Component Planes of
Predicted Frames.

| TYPE | CODE |
|---|---|
| Skipped | 0 |
| Inter | 1 |

Quantization Tables

The following are Quantization Tables 0–15, according to a preferred embodiment of the present invention. These quantization tables are used to quantize both the DCT coefficients for intra blocks and the DCT coefficient differences for inter blocks. The quantization tables were designed such that the finest quantization (i.e., Table 15) is at the level of visual perception and the coarsest quantization (i.e., Table 0) produces encoded signals at half the target bit rate.

TABLE 0

| 64 | 64 | 128 | 128 | 256 | 256 | 256 | 512 |
|---|---|---|---|---|---|---|---|
| 64 | 128 | 128 | 256 | 256 | 256 | 512 | 512 |
| 128 | 128 | 256 | 256 | 256 | 512 | 512 | 512 |
| 128 | 256 | 256 | 256 | 512 | 512 | 512 | 1024 |
| 256 | 256 | 256 | 512 | 512 | 512 | 1024 | 1024 |
| 256 | 256 | 512 | 512 | 512 | 1024 | 1024 | 1024 |
| 256 | 512 | 512 | 512 | 1024 | 1024 | 1024 | 1024 |
| 512 | 512 | 512 | 1024 | 1024 | 1024 | 1024 | 1024 |

TABLE 1

| 64 | 64 | 128 | 128 | 128 | 128 | 256 | 256 |
|---|---|---|---|---|---|---|---|
| 64 | 64 | 128 | 128 | 128 | 256 | 256 | 256 |
| 128 | 128 | 128 | 128 | 256 | 256 | 256 | 512 |
| 128 | 128 | 128 | 256 | 256 | 256 | 512 | 512 |
| 128 | 128 | 256 | 256 | 256 | 512 | 512 | 512 |
| 128 | 256 | 256 | 256 | 512 | 512 | 512 | 1024 |
| 256 | 256 | 256 | 512 | 512 | 512 | 1024 | 1024 |
| 256 | 256 | 512 | 512 | 512 | 1024 | 1024 | 1024 |

TABLE 2

| 32 | 64 | 64 | 64 | 128 | 128 | 128 | 128 |
|---|---|---|---|---|---|---|---|
| 64 | 64 | 64 | 128 | 128 | 128 | 128 | 256 |
| 64 | 64 | 128 | 128 | 128 | 128 | 256 | 256 |
| 64 | 128 | 128 | 128 | 128 | 256 | 256 | 256 |
| 128 | 128 | 128 | 128 | 256 | 256 | 256 | 512 |
| 128 | 128 | 128 | 256 | 256 | 256 | 512 | 512 |
| 128 | 128 | 256 | 256 | 256 | 512 | 512 | 512 |
| 128 | 256 | 256 | 256 | 512 | 512 | 512 | 1024 |

TABLE 3

| 32 | 32 | 64 | 64 | 64 | 64 | 128 | 128 |
|---|---|---|---|---|---|---|---|
| 32 | 64 | 64 | 64 | 64 | 128 | 128 | 128 |
| 64 | 64 | 64 | 64 | 128 | 128 | 128 | 128 |
| 64 | 64 | 64 | 128 | 128 | 128 | 128 | 256 |
| 64 | 64 | 128 | 128 | 128 | 128 | 256 | 256 |
| 64 | 128 | 128 | 128 | 128 | 256 | 256 | 256 |
| 128 | 128 | 128 | 128 | 256 | 256 | 256 | 512 |
| 128 | 128 | 128 | 256 | 256 | 256 | 512 | 512 |

TABLE 4

| 32 | 32 | 32 | 64 | 64 | 64 | 64 | 64 |
|---|---|---|---|---|---|---|---|
| 32 | 32 | 64 | 64 | 64 | 64 | 64 | 128 |
| 32 | 64 | 64 | 64 | 64 | 64 | 128 | 128 |
| 64 | 64 | 64 | 64 | 64 | 128 | 128 | 128 |
| 64 | 64 | 64 | 64 | 128 | 128 | 128 | 128 |

TABLE 4-continued

| | | | | | | | |
|---|---|---|---|---|---|---|---|
| 64 | 64 | 64 | 128 | 128 | 128 | 128 | 256 |
| 64 | 64 | 128 | 128 | 128 | 128 | 256 | 256 |
| 64 | 128 | 128 | 128 | 128 | 256 | 256 | 256 |

TABLE 5

| | | | | | | | |
|---|---|---|---|---|---|---|---|
| 16 | 32 | 32 | 32 | 64 | 64 | 64 | 64 |
| 32 | 32 | 32 | 64 | 64 | 64 | 64 | 64 |
| 32 | 32 | 64 | 64 | 64 | 64 | 64 | 64 |
| 32 | 64 | 64 | 64 | 64 | 64 | 64 | 128 |
| 64 | 64 | 64 | 64 | 64 | 64 | 128 | 128 |
| 64 | 64 | 64 | 64 | 64 | 128 | 128 | 128 |
| 64 | 64 | 64 | 64 | 128 | 128 | 128 | 128 |
| 64 | 64 | 64 | 128 | 128 | 128 | 128 | 256 |

TABLE 6

| | | | | | | | |
|---|---|---|---|---|---|---|---|
| 16 | 32 | 32 | 32 | 32 | 64 | 64 | 64 |
| 32 | 32 | 32 | 32 | 64 | 64 | 64 | 64 |
| 32 | 32 | 32 | 64 | 64 | 64 | 64 | 64 |
| 32 | 32 | 64 | 64 | 64 | 64 | 64 | 64 |
| 32 | 64 | 64 | 64 | 64 | 64 | 64 | 64 |
| 64 | 64 | 64 | 64 | 64 | 64 | 64 | 128 |
| 64 | 64 | 64 | 64 | 64 | 64 | 128 | 128 |
| 64 | 64 | 64 | 64 | 64 | 128 | 128 | 128 |

TABLE 7

| | | | | | | | |
|---|---|---|---|---|---|---|---|
| 16 | 16 | 32 | 32 | 32 | 32 | 64 | 64 |
| 16 | 32 | 32 | 32 | 32 | 64 | 64 | 64 |
| 32 | 32 | 32 | 32 | 64 | 64 | 64 | 64 |
| 32 | 32 | 32 | 64 | 64 | 64 | 64 | 64 |
| 32 | 32 | 64 | 64 | 64 | 64 | 64 | 64 |
| 32 | 64 | 64 | 64 | 64 | 64 | 64 | 64 |
| 64 | 64 | 64 | 64 | 64 | 64 | 64 | 64 |
| 64 | 64 | 64 | 64 | 64 | 64 | 64 | 128 |

TABLE 8

| | | | | | | | |
|---|---|---|---|---|---|---|---|
| 16 | 16 | 16 | 32 | 32 | 32 | 32 | 32 |
| 16 | 16 | 32 | 32 | 32 | 32 | 32 | 64 |
| 16 | 32 | 32 | 32 | 32 | 32 | 64 | 64 |
| 32 | 32 | 32 | 32 | 32 | 64 | 64 | 64 |
| 32 | 32 | 32 | 32 | 64 | 64 | 64 | 64 |
| 32 | 32 | 32 | 64 | 64 | 64 | 64 | 64 |
| 32 | 32 | 64 | 64 | 64 | 64 | 64 | 64 |
| 32 | 64 | 64 | 64 | 64 | 64 | 64 | 64 |

TABLE 9

| | | | | | | | |
|---|---|---|---|---|---|---|---|
| 8 | 16 | 16 | 16 | 32 | 32 | 32 | 32 |
| 16 | 16 | 16 | 32 | 32 | 32 | 32 | 32 |
| 16 | 16 | 32 | 32 | 32 | 32 | 32 | 32 |
| 16 | 32 | 32 | 32 | 32 | 32 | 32 | 64 |
| 32 | 32 | 32 | 32 | 32 | 32 | 64 | 64 |
| 32 | 32 | 32 | 32 | 32 | 64 | 64 | 64 |
| 32 | 32 | 32 | 32 | 64 | 64 | 64 | 64 |
| 32 | 32 | 32 | 64 | 64 | 64 | 64 | 64 |

TABLE 10

| | | | | | | | |
|---|---|---|---|---|---|---|---|
| 8 | 8 | 16 | 16 | 16 | 16 | 32 | 32 |
| 8 | 16 | 16 | 16 | 16 | 32 | 32 | 32 |
| 16 | 16 | 16 | 16 | 32 | 32 | 32 | 32 |
| 16 | 16 | 16 | 32 | 32 | 32 | 32 | 32 |
| 16 | 16 | 32 | 32 | 32 | 32 | 32 | 32 |
| 16 | 32 | 32 | 32 | 32 | 32 | 32 | 64 |

TABLE 10-continued

| | | | | | | | |
|---|---|---|---|---|---|---|---|
| 32 | 32 | 32 | 32 | 32 | 32 | 64 | 64 |
| 32 | 32 | 32 | 32 | 32 | 64 | 64 | 64 |

TABLE 11

| | | | | | | | |
|---|---|---|---|---|---|---|---|
| 8 | 8 | 8 | 8 | 16 | 16 | 16 | 16 |
| 8 | 8 | 8 | 16 | 16 | 16 | 16 | 32 |
| 8 | 8 | 16 | 16 | 16 | 16 | 32 | 32 |
| 8 | 16 | 16 | 16 | 16 | 32 | 32 | 32 |
| 16 | 16 | 16 | 16 | 32 | 32 | 32 | 32 |
| 16 | 16 | 16 | 32 | 32 | 32 | 32 | 32 |
| 16 | 16 | 32 | 32 | 32 | 32 | 32 | 32 |
| 16 | 32 | 32 | 32 | 32 | 32 | 32 | 32 |

TABLE 12

| | | | | | | | |
|---|---|---|---|---|---|---|---|
| 8 | 8 | 8 | 8 | 8 | 8 | 16 | 16 |
| 8 | 8 | 8 | 8 | 8 | 16 | 16 | 16 |
| 8 | 8 | 8 | 8 | 16 | 16 | 16 | 16 |
| 8 | 8 | 8 | 16 | 16 | 16 | 16 | 16 |
| 8 | 8 | 16 | 16 | 16 | 16 | 16 | 16 |
| 8 | 16 | 16 | 16 | 16 | 16 | 16 | 32 |
| 16 | 16 | 16 | 16 | 16 | 16 | 32 | 32 |
| 16 | 16 | 16 | 16 | 16 | 32 | 32 | 32 |

TABLE 13

| | | | | | | | |
|---|---|---|---|---|---|---|---|
| 8 | 8 | 8 | 8 | 8 | 8 | 8 | 8 |
| 8 | 8 | 8 | 8 | 8 | 8 | 8 | 16 |
| 8 | 8 | 8 | 8 | 8 | 8 | 16 | 16 |
| 8 | 8 | 8 | 8 | 8 | 16 | 16 | 16 |
| 8 | 8 | 8 | 8 | 16 | 16 | 16 | 16 |
| 8 | 8 | 8 | 16 | 16 | 16 | 16 | 16 |
| 8 | 8 | 16 | 16 | 16 | 16 | 16 | 16 |
| 8 | 16 | 16 | 16 | 16 | 16 | 16 | 32 |

TABLE 14

| | | | | | | | |
|---|---|---|---|---|---|---|---|
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 16 |
| 8 | 8 | 8 | 8 | 8 | 8 | 16 | 16 |
| 8 | 8 | 8 | 8 | 8 | 16 | 16 | 16 |
| 8 | 8 | 8 | 8 | 16 | 16 | 16 | 16 |

TABLE 15

| | | | | | | | |
|---|---|---|---|---|---|---|---|
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 8 |
| 8 | 8 | 8 | 8 | 8 | 8 | 8 | 8 |

Those skilled in the art will understand that the video compression and decompression processes of the present invention may provide video quality higher than that under the H.261 (Px64) and ISO/IEC 11172-2 (MPEG) video standards when run at low data rates due to the lower overhead of the present invention. It will also be understood that the compressed video signals generated under the present invention are relatively easy to decode compared with those signals generated under the Px64 and MPEG standards.

Those skilled in the art will understand that conferencing networks with more than two PC nodes fall within the scope of the present invention. It will also be understood that the present invention may be used in the systems other than those for audio/video conferencing.

Those skilled in the art will also understand that PC systems under the present invention may be used to compress video signals for storage to a mass storage device such as a hard drive for future processing. Similarly, such PC systems may be used to decompress compressed video signals that are stored in a mass storage device such as a CD-ROM.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A computer-implemented process for transforming a variable-length encoded signal into a decoded signal, wherein the variable-length encoded signal comprises up to M bits, comprising the steps of:

(a) reading N bits from a bit stream comprising the variable-length encoded signal, wherein N is less than M;

(b) accessing an N-bit lookup table using the N bits from the bit stream as an index to retrieve a table entry, wherein the table entry comprises:
        a flag bit indicating whether the variable-length encoded signal is a short code signal or a long code signal;
        one or more code-length bits; and
        one or more code-value bits;

(c) if the flag bit indicates that the variable-length encoded signal is a short code signal, then generating the decoded signal using the code-value bits, wherein the code-length bits indicate the length of the variable-length encoded signal; and (d) if the flag bit indicates that the variable-length encoded signal is a long code signal, then generating the decoded signal using the code-value bits and one or more additional bits from the bit stream, wherein the code-length bits indicate the number of additional bits to be read from the bit stream to complete the variable-length encoded signal.

2. The process of claim 1, wherein step (d) comprises the step of generating the decoded signal by adding the value of the code-value bits to the value of the additional bits.

3. The process of claim 1, further comprising the steps of:

(e) adjusting a bit stream pointer in accordance with the code-length bits; and (f) repeating steps (a)–(d) for another N bits of the bit stream.

4. The process of claim 3, wherein step (e) comprises the steps of:

(1) adjusting the bit stream pointer by the value of the code-length bits, if the flag bit indicates that the variable-length encoded signal is a short code signal; and (2) adjusting the bit stream pointer by N plus the value of the code-length bits, if the flag bit indicates that the variable-length encoded signal is a long code signal.

5. The process of claim 1, wherein:

N equals 8;

the table entry comprises 4 code-length bits, 1 flag bit, and 1 sign bit;

if the flag bit indicates that the variable-length encoded signal is a short code signal, then the table entry further comprises 8 code-value bits; and if the flag bit indicates that the variable-length encoded signal is a long code signal, then the table entry further comprises 10 code-value bits.

6. The process of claim 1, wherein the variable-length encoded signal corresponds to signals of a video image.

7. The process of claim 1, wherein:

N equals 8;

the table entry comprises 4 code-length bits, 1 flag bit, and 1 sign bit;

if the flag bit indicates that the variable-length encoded signal is a short code signal, then the table entry further comprises 8 code-value bits;

if the flag bit indicates that the variable-length encoded signal is a long code signal, then the table entry further comprises 10 code-value bits;

the variable-length encoded signal corresponds to signals of a video image;

step (d) comprises the step of generating the decoded signal by adding the value of the code-value bits to the value of the additional bits; and further comprising the steps of:

(e) adjusting a bit stream pointer in accordance with the code-length bits; and (f) repeating steps (a)–(d) for another N bits of the bit stream, wherein step (e) comprises the steps of:

(1) adjusting the bit stream pointer by the value of the code-length bits, if the flag bit indicates that the variable-length encoded signal is a short code signal; and (2) adjusting the bit stream pointer by N plus the value of the code-length bits, if the flag bit indicates that the variable-length encoded signal is a long code signal.

8. An apparatus for transforming a variable-length encoded signal into a decoded signal, wherein the variable-length encoded signal comprises up to M bits, comprising:

(a) means for reading N bits from a bit stream comprising the variable-length encoded signal, wherein N is less than M;

(b) means for accessing an N-bit lookup table using the N bits from the bit stream as an index to retrieve a table entry, wherein the table entry comprises:
        a flag bit indicating whether the variable-length encoded signal is a short code signal or a long code signal;
        one or more code-length bits; and
        one or more code-value bits;

(c) means for generating the decoded signal, wherein:
        if the flag bit indicates that the variable-length encoded signal is a short code signal, then the decoded signal is generated using the code-value bits, wherein the code-length bits indicate the length of the variable-length encoded signal; and
        if the flag bit indicates that the variable-length encoded signal is a long code signal, then the decoded signal is generated using the code-value bits and one or more additional bits from the bit stream, wherein the code-length bits indicate the number of additional bits to be read from the bit stream to complete the variable-length encoded signal.

9. The apparatus of claim 8, wherein means (c) generates the decoded signal by adding the value of the code-value bits to the value of the additional bits, if the flag bit indicates that the variable-length encoded signal is a long code signal.

10. The apparatus of claim 8, further comprising:
   (d) means for adjusting a bit stream pointer in accordance with the code-length bits; and
   (e) means for repeating the processing of means (a)–(c) for another N bits of the bit stream.

11. The apparatus of claim 10, wherein means (d):
   (1) adjusts the bit stream pointer by the value of the code-length bits, if the flag bit indicates that the variable-length encoded signal is a short code signal; and
   (2) adjusts the bit stream pointer by N plus the value of the code-length bits, if the flag bit indicates that the variable-length encoded signal is a long code signal.

12. The apparatus of claim 8, wherein:
   N equals 8;
   the table entry comprises 4 code-length bits, 1 flag bit, and 1 sign bit;
   if the flag bit indicates that the variable-length encoded signal is a short code signal, then the table entry further comprises 8 code-value bits; and
   if the flag bit indicates that the variable-length encoded signal is a long code signal, then the table entry further comprises 10 code-value bits.

13. The apparatus of claim 8, wherein the variable-length encoded signal corresponds to signals of a video image.

14. The apparatus of claim 8, wherein:
   N equals 8;
   the table entry comprises 4 code-length bits, 1 flag bit, and 1 sign bit;
   if the flag bit indicates that the variable-length encoded signal is a short code signal, then the table entry further comprises 8 code-value bits;
   if the flag bit indicates that the variable-length encoded signal is a long code signal, then the table entry further comprises 10 code-value bits;
   the variable-length encoded signal corresponds to signals of a video image;
   means (c) generates the decoded signal by adding the value of the code-value bits to the value of the additional bits, if the flag bit indicates that the variable-length encoded signal is a long signal; and
   further comprising:
   (d) means for adjusting a bit stream pointer in accordance with the code-length bits; and
   (e) means for repeating the processing of means (a)–(c) for the next N bits of the bit stream, wherein means (d):
   (1) adjusts the bit stream pointer by the value of the code-length bits, if the flag bit indicates that the variable-length encoded signal is a short code signal; and
   (2) adjusts the bit stream pointer by N plus the value of the code-length bits, if the flag bit indicates that the variable-length encoded signal is a long code signal.

15. The apparatus of claim 14, wherein the apparatus is a microprocessor and the microprocessor is electrically connected to a memory device via a data bus.

16. The apparatus of claim 8, wherein the apparatus is a microprocessor and the microprocessor is electrically connected to a memory device via a data bus.

* * * * *